(12) United States Patent
Park et al.

(10) Patent No.: US 10,910,376 B2
(45) Date of Patent: Feb. 2, 2021

(54) SEMICONDUCTOR DEVICES INCLUDING DIFFUSION BREAK REGIONS

(71) Applicant: Samsung Electronics Co., Ltd., Suwon-si (KR)

(72) Inventors: Jun Mo Park, Hwaseong-si (KR); Ju Youn Kim, Hwaseong-si (KR); Hyung Joo Na, Hwaseong-si (KR); Sang Min Yoo, Hwaseong-si (KR); Eui Chul Hwang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/290,222

(22) Filed: Mar. 1, 2019

(65) Prior Publication Data
US 2020/0058652 A1 Feb. 20, 2020

(30) Foreign Application Priority Data
Aug. 14, 2018 (KR) .......................... 10-2018-0095110

(51) Int. Cl.
| | | |
|---|---|---|
| H01L 21/00 | (2006.01) | |
| H01L 27/092 | (2006.01) | |
| H01L 29/06 | (2006.01) | |
| H01L 21/8238 | (2006.01) | |
| H01L 29/78 | (2006.01) | |
| H01L 29/66 | (2006.01) | |

(52) U.S. Cl.
CPC .. *H01L 27/0924* (2013.01); *H01L 21/823821* (2013.01); *H01L 21/823828* (2013.01); *H01L 21/823864* (2013.01); *H01L 21/823878* (2013.01); *H01L 29/0649* (2013.01); *H01L 29/66545* (2013.01); *H01L 29/66553* (2013.01); *H01L 29/66795* (2013.01); *H01L 29/7851* (2013.01)

(58) Field of Classification Search
CPC ............ H01L 27/0924; H01L 29/0649; H01L 21/823821
See application file for complete search history.

(56) References Cited

U.S. PATENT DOCUMENTS

| | | | | |
|---|---|---|---|---|
| 8,148,052 B2 * | 4/2012 | Vanleenhove | ............ | G03F 7/11 430/315 |
| 9,171,752 B1 * | 10/2015 | Wu | ...................... | H01L 29/0653 |
| 9,218,973 B2 * | 12/2015 | Nainani | ............ | H01L 29/66803 |
| 9,263,516 B1 | 2/2016 | Wu et al. | | |

(Continued)

*Primary Examiner* — Laura M Menz
(74) *Attorney, Agent, or Firm* — Myers Bigel, P.A.

(57) ABSTRACT

Semiconductor devices and methods of forming the same are provided. Semiconductor devices may include a substrate including first and second regions, first active fins extending in a first direction on the first region, second active fins extending parallel to the first active fins on the second region, and single diffusion break regions between two first active fins. Single diffusion break regions may be spaced apart from each other in the first direction. The semiconductor devices may also include a lower diffusion break region between two second active fins and extending in a second direction that is different from the first direction and upper diffusion break regions on the lower diffusion break region. The upper diffusion break regions may be spaced apart from each other in the first direction, and each of the upper diffusion break regions may overlap the lower diffusion break region.

18 Claims, 26 Drawing Sheets

(56) References Cited

U.S. PATENT DOCUMENTS

| | | | |
|---|---|---|---|
| 9,362,181 B1 * | 6/2016 | Xie | H01L 21/823878 |
| 9,406,676 B2 * | 8/2016 | Yu | H01L 21/76224 |
| 9,412,616 B1 | 8/2016 | Xie et al. | |
| 9,563,733 B2 * | 2/2017 | Becker | H01L 27/092 |
| 9,570,307 B2 | 2/2017 | Nainani et al. | |
| 9,570,442 B1 | 2/2017 | Liu et al. | |
| 9,589,802 B1 * | 3/2017 | Hatem | H01L 21/26506 |
| 9,589,845 B1 * | 3/2017 | Jagannathan | H01L 29/7851 |
| 9,653,583 B1 * | 5/2017 | Zhao | H01L 29/66795 |
| 9,793,273 B2 * | 10/2017 | Liaw | H01L 21/823418 |
| 9,865,704 B2 | 1/2018 | Xie et al. | |
| 9,887,210 B2 * | 2/2018 | Song | H01L 27/092 |
| 9,929,160 B1 * | 3/2018 | Lee | H01L 29/42356 |
| 9,935,113 B2 | 4/2018 | Wu et al. | |
| 2015/0050792 A1 | 2/2015 | Samavedam et al. | |
| 2015/0123211 A1 | 5/2015 | Zhang et al. | |
| 2016/0093511 A1 | 3/2016 | Sengupta et al. | |
| 2017/0170171 A1 | 6/2017 | Jagannathan et al. | |
| 2017/0170176 A1 | 6/2017 | Jagannathan et al. | |
| 2017/0178908 A1 | 6/2017 | Hatem et al. | |
| 2017/0287933 A1 * | 10/2017 | Chen | H01L 27/11807 |
| 2018/0006035 A1 | 1/2018 | Yuan et al. | |
| 2018/0061943 A1 | 3/2018 | Choi et al. | |
| 2018/0069092 A1 | 3/2018 | Samavedan et al. | |
| 2018/0083036 A1 | 3/2018 | Agarwal et al. | |
| 2018/0090493 A1 | 3/2018 | Kwak et al. | |

* cited by examiner

SEMICONDUCTOR DEVICES INCLUDING DIFFUSION BREAK REGIONS

CROSS-REFERENCE TO RELATED APPLICATION

This U.S. non-provisional patent application claims priority under 35 U.S.C. § 119 to Korean Patent Application No. 10-2018-0095110, filed on Aug. 14, 2018, the disclosure of which is incorporated herein by reference in its entirety.

BACKGROUND

The present disclosure generally relates to the field of electronics and, more particularly, to a semiconductor device.

With an increase in the integration density of semiconductor devices, it is becoming increasingly difficult to meet transistor performance required by users. To improve transistor performance, various materials and/or structures for field-effect transistor (FET) have been proposed. For example, a high-k dielectric-metal gate structure has been proposed to replace a conventional FET including a silicon oxide gate insulating layer and a polycrystalline silicon gate electrode.

SUMMARY

Example embodiments of the inventive concept are directed to providing a semiconductor device having improved performance.

In addition, example embodiments of the inventive concept are directed to providing a semiconductor device having reduced variations in device characteristics.

According to example embodiments, semiconductor devices may include a substrate including a first region and a second region, a plurality of first active fins extending in a first direction on the first region, a plurality of second active fins extending parallel to the plurality of first active fins on the second region, and a plurality of single diffusion break regions between two first active fins of the plurality of first active fins. The plurality of single diffusion break regions may be spaced apart from each other in the first direction. The semiconductor devices may also include a lower diffusion break region between two second active fins of the plurality of second active fins and extending in a second direction that is different from the first direction and a plurality of upper diffusion break regions on the lower diffusion break region. The plurality of upper diffusion break regions may be spaced apart from each other in the first direction, and each of the plurality of upper diffusion break regions may overlap the lower diffusion break region.

According to example embodiments, semiconductor devices may include a substrate including a first region and a second region and a plurality of first active fins extending in a first direction on the first region. Two first active fins of the plurality of first active fins may define a first fin recess in the first region of the substrate. The semiconductor devices may also include a plurality of second active fins extending parallel to the plurality of first active fins on the second region of the substrate and a first gate structure and a second gate structure. Each of the first and second gate structures may traverse one of the plurality of first active fins and one of the plurality of second active fins and having a first width in the first direction. The semiconductor devices may further include first and second outer spacers between the first and second gate structures. The first and second outer spacers may be spaced apart from each other by a first distance in the first direction, the first distance may be at least twice the first width, the first and second outer spacers may define a first gate trench therebetween, and the first gate trench may be connected to the first fin recess. Additionally, the semiconductor devices may include a double diffusion break region in the first fin recess and the first gate trench, a lower diffusion break region in the second region of the substrate between two second active fins of the plurality of second active fins, and first and second inside spacers on the lower diffusion break region between the first and second outer spacers. The first outer spacer, the first inner spacer, the second inner spacer, and the second outer spacer may be sequentially arranged along the first direction, and two second gate trenches may be defined by a pair of the first outer spacer and the first inner spacer and a pair of the second inner spacer and the second outer spacer. The semiconductor devices may further include two upper diffusion break regions in the two second gate trenches, respectively.

According to example embodiments, semiconductor devices may include a substrate including a P-type metal-oxide-semiconductor (PMOS) region and an N-type MOS (NMOS) region, a plurality of first active fins extending in a first direction on the PMOS region, a plurality of second active fins extending parallel to the plurality of first active fins on the NMOS region, and a first gate structure and a second gate structure extending in a second direction and being spaced apart from each other in the first direction. Each of the first and second gate structures may traverse one of the plurality of first active fins and one of the plurality of second active fins. The semiconductor devices may also include a lower diffusion break region in the NMOS region of the substrate between two second active fins of plurality of the second active fins and between the first gate structure and the second gate structure and an upper diffusion break region on the lower diffusion break region.

DETAILED DESCRIPTION

Hereinafter, semiconductor devices and methods of manufacturing the same according to embodiments of the inventive concept will be described with reference to the accompanying drawings. Like reference numbers refer to like elements throughout.

Figure 1:
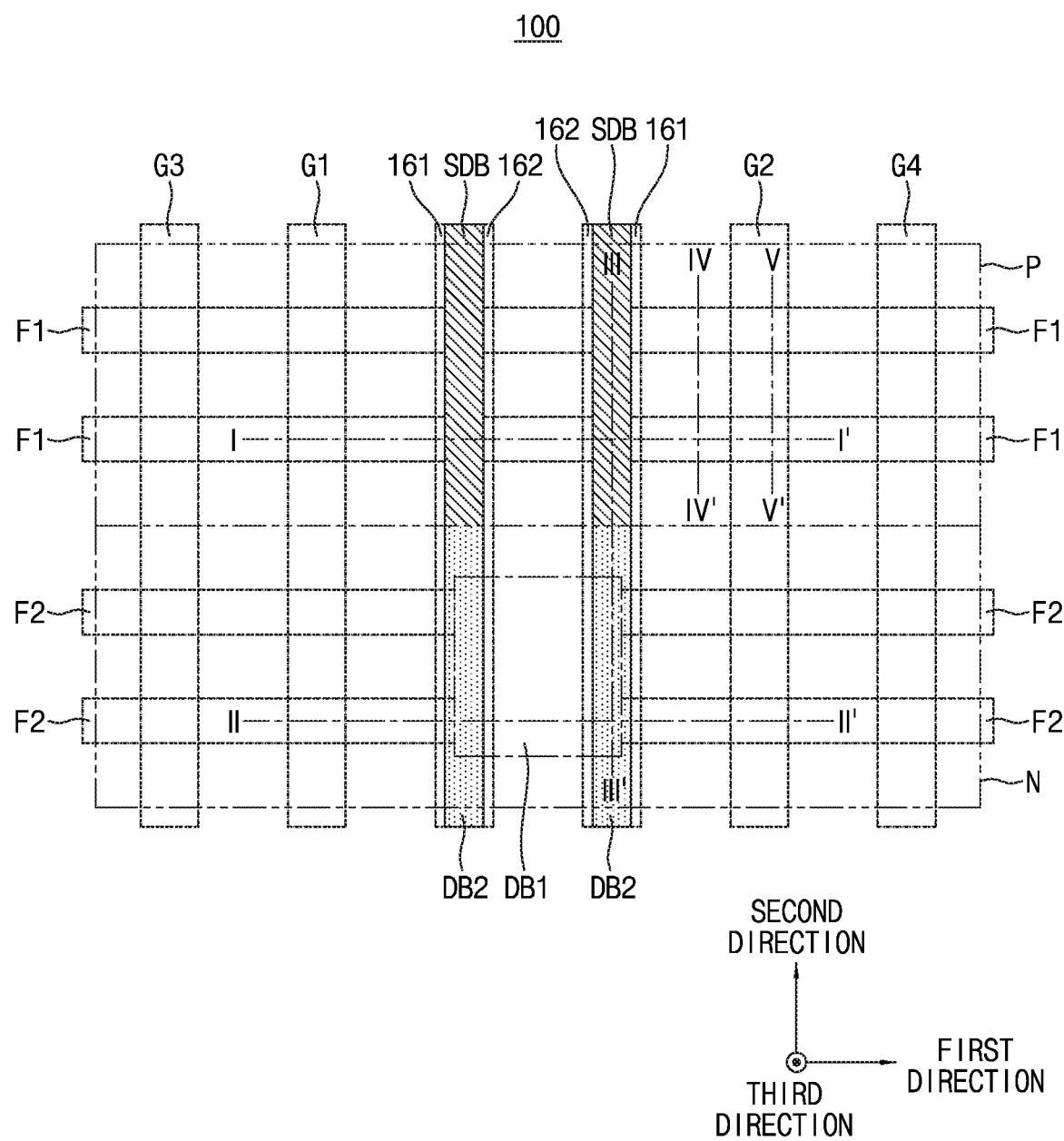
FIG. 1. schematically illustrates a layout of a partial region of a semiconductor device according to some embodiments of the inventive concept.
Figure 2A:
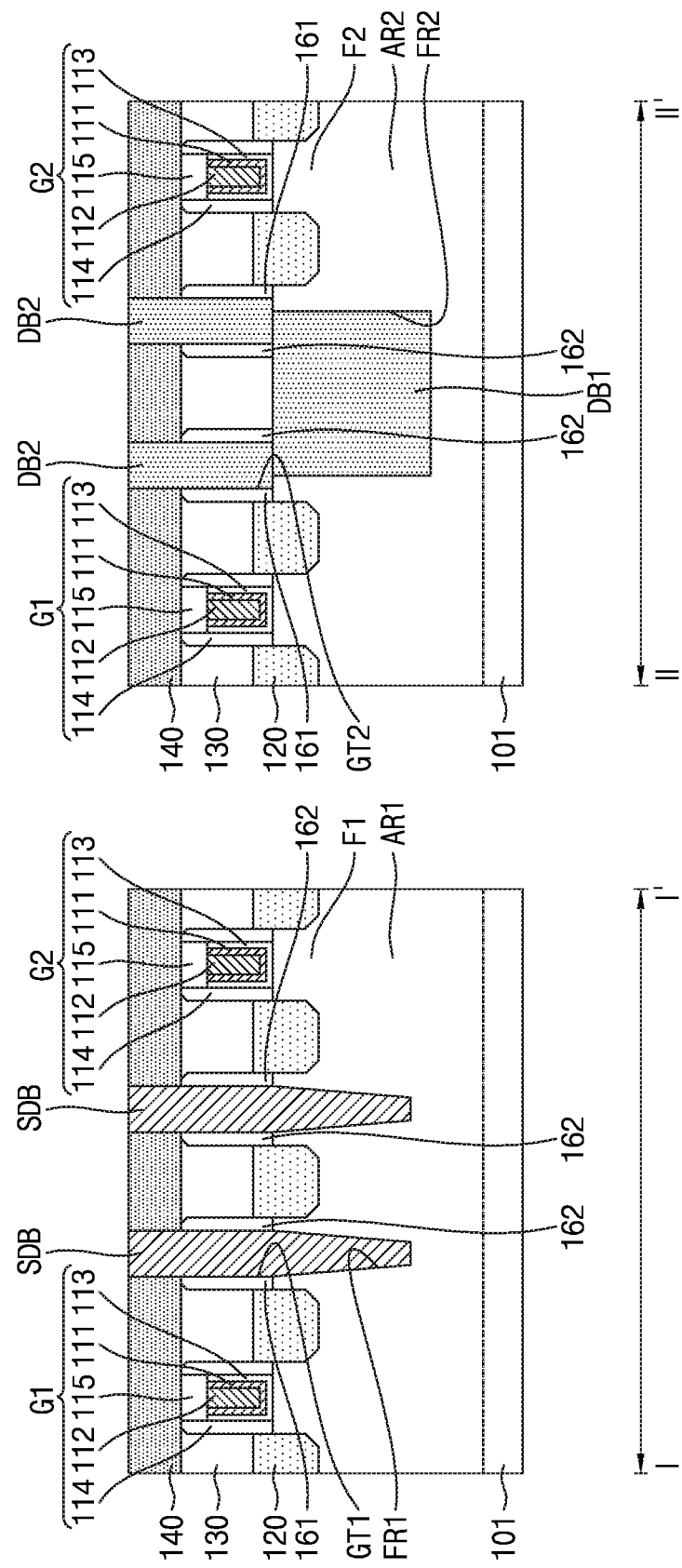
FIG. 2A shows vertical cross-sectional views taken along lines I-I' and II-IF of FIG. 1 according to some embodiments of the inventive concept.
Figure 2B:
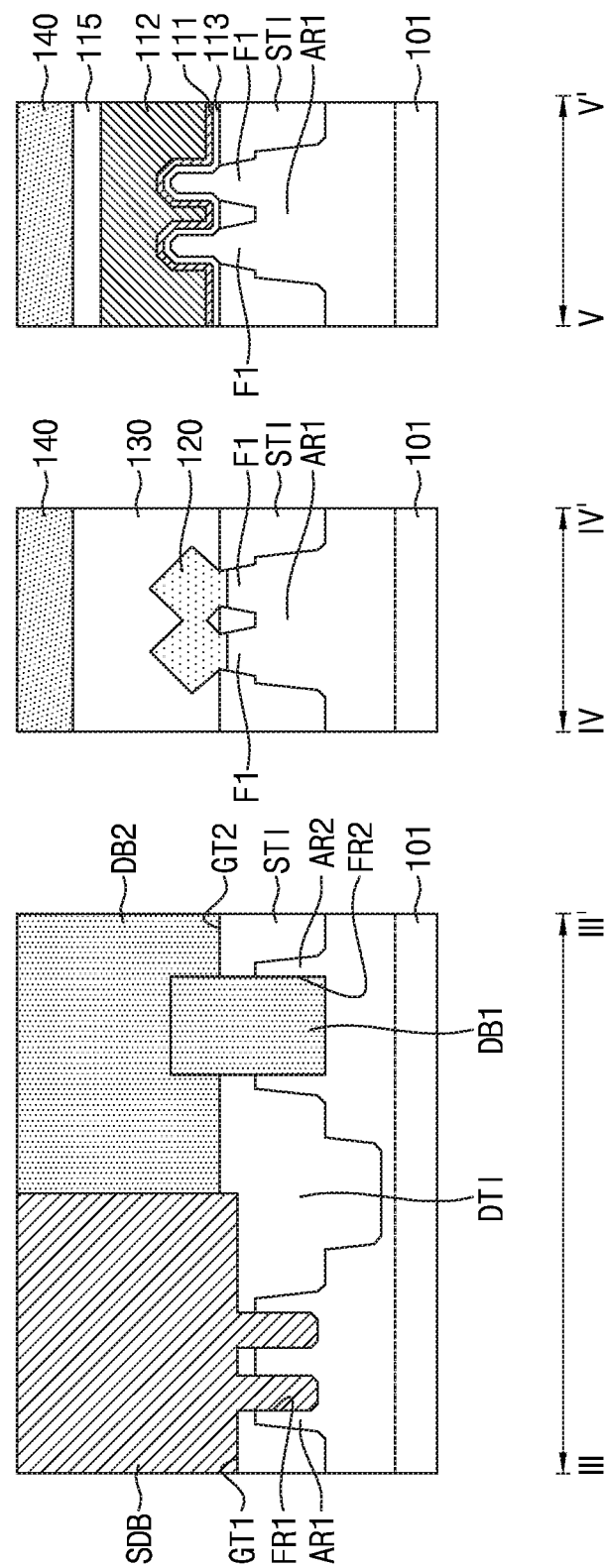
FIG. 2B shows vertical cross-sectional views taken along lines IV-IV', and V-V' of FIG. 1 according to some embodiments of the inventive concept.

FIG. 1 schematically illustrates a layout of a partial region of a semiconductor device according to some embodiments of the inventive concept. FIG. 2A shows vertical cross-sectional views taken along lines I-I' and II-IF of FIG. 1. FIG. 2B shows vertical cross-sectional views taken along lines IV-IV', and V-V' of FIG. 1.

Referring to FIGS. 1 to 2B, the semiconductor device 100 according to the embodiment of the inventive concept may include a substrate 101, active regions AR1 and AR2, active fins F1 and F2, a device isolation layer STI and DTI, gate structures G1, G2, G3, and G4, source and drain regions 120, an interlayer insulating layer 140, a mask layer 140, dummy spacers 161 and 162, gate trenches GT1 and GT2, fin recesses FR1 and FR2, a single diffusion break region SDB, a lower diffusion break region DB1, and an upper diffusion break region DB2.

The substrate 101 may include a first region P and a second region N. For example, the first region P may be a P-type metal-oxide-semiconductor (PMOS) region, and the second region N may be an N-type MOS (NMOS) region. The substrate 101 may include a semiconductor material, such as silicon (Si) and germanium (Ge). For example, the substrate 101 may be formed of at least one material selected out of silicon (Si), germanium (Ge), silicon germanium (SiGe), gallium phosphide (GaP), gallium arsenide (GaAs), silicon carbide (SiC), silicon germanium carbide (SiGeC), indium arsenide (InAs), and indium phosphide (InP). However, the substrate 101 according to the inventive concept is not limited to the above-described examples. In some embodiments, the substrate 101 may be a silicon on insulator (SOI) substrate.

The active regions AR1 and AR2 may include a first active region AR1 and a second active region AR2. The first active region AR1 may be disposed in the first region P, and the second active region AR2 may be disposed in the second region N. The active regions AR1 and AR2 may elongate in a first direction. In some embodiments, the active regions AR1 and AR2 may extend longitudinally in the first direction. The active regions AR1 and AR2 may be spaced apart from each other in a second direction intersecting the first direction. The active regions AR1 and AR2 may protrude in a third direction, which is vertical to the main surface of the substrate 101. In some embodiments, the third direction may be perpendicular to both the first direction and the second direction.

The active fins F1 and F2 may include a first active fin F1 disposed in the first region P and a second active fin F2 disposed in the second region N. The first active fin F1 may be disposed on the first active region AR1, and the second active fin F2 may be disposed on the second active region AR2. The active fins F1 and F2 may be disposed apart from each other on the active regions AR1 and AR2 in the first direction and the second direction. The active fins F1 and F2 may protrude in the third direction in the active regions AR1 and AR2. The active fins F1 and F2 may elongate in the first direction. In some embodiments, each of the active fins F1 and F2 may extend longitudinally in the first direction as illustrated in FIG. 1. Each of the active fins F1 and F2 may include a long side extending in the first direction and a short side extending in the second direction.

The active regions AR1 and AR2 and the active fins F1 and F2 may be portions of the substrate 101 and may include epitaxial layers grown from the substrate 101. In some embodiments, the active regions AR1 and AR2 and the active fins F1 and F2 may include a semiconductor material. For example, the active regions AR1 and AR2 and the active fins F1 and F2 may include silicon (Si), silicon germanium (SiGe), or the like. In some embodiments, the active regions AR1 and AR2 and the active fins F1 and F2 may include the same material as the substrate 101. For example, when the substrate 101 includes silicon, the active regions AR1 and AR2 and the active fins F1 and F2 may also include silicon. However, the inventive concept is not limited thereto, and the substrate 101 may include a different material from the active regions AR1 and AR2 and the active fins F1 and F2.

The device isolation layer STI and DTI may include a shallow device isolation layer STI and a deep device isolation layer DTI. The device isolation layer STI and DTI may define the active regions AR1 and AR2 and the active fins F1 and F2. In some embodiments, the device isolation layer STI and DTI may cover sidewalls of the active regions AR1 and AR2 on the substrate 101 as illustrated in FIG. 2B. The device isolation layer STI and DTI may cover only lower sidewalls of the active fins F1 and F2 but may not cover upper sidewalls thereof. The shallow device isolation layer STI may be disposed in the first region P and the second region N. The deep device isolation layer DTI may be disposed between the first region P and the second region N. A bottom surface of the deep device isolation layer DTI may be at a lower level than a bottom surface of the shallow device isolation layer STI. For example, the device isolation layer STI and DTI may include any one of oxide, oxynitride, and nitride. It will be understood that "an element A covers a surface of an element B" (or similar language) means that the element A is on the surface of the element B but does not necessarily mean that the element A covers the surface of the element B entirely.

The gate structures G1, G2, G3, and G4 may include first, second, third and fourth gate structures. The gate structures G1, G2, G3, and G4 may extend in the second direction on the active fins F1 and F2. The gate structures G1, G2, G3, and G4 may be spaced apart from each other in the first direction. The gate structures G1, G2, G3, and G4 may be disposed on the active fins F1 and F2 and the device isolation layer STI.

Each of the gate structures G1, G2, G3, and G4 may include a gate electrode 111 and 112, a gate insulating layer 113, gate spacers 114, and a gate capping layer 115. The gate electrode 111 and 112 may include at least two layers that are stacked. In some embodiments, the gate electrode 111 and 112 may include a first gate metal layer 111 and a second gate metal layer 112. The first gate metal layer 111 may control or regulate a work function, and the second gate metal layer 112 may fill a space formed by the first gate metal layer 111. Further, the first gate metal layer 111 may include, for example, at least one of titanium nitride (TiN), tungsten nitride (WN), titanium aluminide (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), and a combination thereof. In addition, the second gate metal layer 112 may include, for example, at least one of tungsten (W), aluminum (Al), cobalt (Co), titanium (Ti), tantalum (Ta), polysilicon (poly-Si), silicon germanium (SiGe), and a metal alloy. It will be understood that "an element A fills an element B" (or similar language) means that the element A is in the element B but does not necessarily mean that the element A completely fills the element B.

The gate insulating layer 113 may be disposed between the gate electrode 111 and 112 and the active fins F1 and F2. Further, the gate insulating layer 113 may be disposed between the gate electrode 111 and 112 and the device isolation layers DTI and STI. The gate insulating layer 113 may extend in the second direction along profiles of the active fins F1 and F2 protruding upward from the device isolation layers DTI and STI. The gate insulating layer 113 may be formed in a shape extending in the third direction along a side surface of the gate electrode 111 and 112. For example, the gate electrode 111 and 112 and the gate insulating layer 113 may be formed using a replacement process (e.g., a gate last process). The gate insulating layer 113 may include, for example, a high-k dielectric material having a higher dielectric constant than that of a silicon oxide film. For example, the gate insulating layer 113 may include hafnium oxide ($HfO_2$), zirconium oxide ($ZrO_2$), lanthanum oxide (LaO), aluminum oxide ($Al_2O_3$), tantalum oxide ($Ta_2O_5$), or the like.

The gate spacers 114 may be disposed on both sides of the gate electrode 111 and 112 and the gate insulating layer 113, which may extend in the second direction. The gate spacers 114 may be in contact with both side surfaces of the gate insulating layer 113. The gate spacers 114 may include, for example, a nitride film. For example, the gate spacers 114 may include at least one of silicon nitride, silicon oxynitride, silicon oxide, silicon oxycarbonitride and a combination thereof.

The gate capping layer 115 may be disposed on the gate electrode 111 and 112 and the gate insulating layer 113. The gate capping layer 115 may extend in the second direction between the gate spacers 114. A top surface of the gate capping layer 115 may be substantially coplanar with top surfaces of the gate spacers 114. In other words, the top surface of the gate capping layer 115 may be at substantially the same level as the top surfaces of the gate spacers 114. For example, the gate capping layer 115 may include at least one of a silicon nitride film and a silicon oxynitride film. In some embodiments, the gate capping layer 115 may be omitted.

The source and drain regions 120 may be disposed on both sides of the gate structures G1, G2, G3, and G4. The source and drain regions 120 may be disposed in the active fins F1 and F2. That is, the source and drain regions 120 may be in regions of the active fins F1 and F2, which are formed by partially etching the active fins F1 and F2. Although FIG. 2B illustrates a case in which two adjacent source and drain regions 120 are in contact with each other in the second direction, the inventive concept is not limited thereto, and, in some embodiments, the two adjacent source and drain regions 120 may be spaced apart from each other in the second direction. In some embodiments, the source and drain regions 120 may be elevated source and drain regions. Thus, upper ends of the source and drain regions 120 may be at a higher level than upper ends of the active fins F1 and F2.

In some embodiments, when a transistor including the source and drain regions 120 is a PMOS transistor, the source and drain regions 120 may include a compressive stress material. For example, the compressive stress material may be a material (e.g., SiGe) having a higher lattice constant than silicon. The compressive stress material may apply compressive stress to the active fins F1 and F2 (i.e., channel regions) under the gate structures G1, G2, G3, and G4 and improve the mobility of carriers in the channel regions. In some embodiments, when a transistor including the source and drain regions 120 is an NMOS transistor, the source and drain region 120 may include the same material as the substrate 101 or a tensile stress material. For instance, when the substrate 101 includes silicon, the source and drain regions 120 may include silicon or a material (e.g., silicon carbide (SiC) and silicon phosphide (SiP)) having a lower lattice constant than silicon. The tensile stress material may apply tensile stress to the active fins F1 and F2 (i.e., the channel regions) under the gate structures G1, G2, G3, and G4 and improve the mobility of carries in the channel regions.

In some embodiments, the source and drain regions 120 may be formed using an epitaxial growth process. Although not shown, a silicon film may be formed on the source and drain regions 120. The silicide film may be formed along top surfaces of the source and drain regions 120. The silicide film may reduce a sheet resistance or a contact resistance when the source and drain regions 120 are in contact with contacts. The silicide film may include a conductive material, for example, platinum (Pt), nickel (Ni), cobalt (Co), or the like. The contacts may be formed on the silicide film. The contacts may be formed of a conductive material. The contact may include, for example, tungsten (W), aluminum (Al), copper (Cu), or the like.

The interlayer insulating layer 130 may be disposed on the source and drain regions 120 and the device isolation layer STI and DTI. Further, the interlayer insulating layer 130 may be formed to be in contact with outer sidewalls of the gate spacers 114. The interlayer insulating layer 130 may include, for example, at least one of silicon oxide, silicon nitride, silicon oxynitride, and a low-k dielectric material.

The mask layer 140 may be disposed on the gate structures G1, G2, G3, and G4 and the interlayer insulating layer 130. The mask layer 140 may cover top surfaces of the gate structures G1, G2, G3, and G4 and the top surfaces of the interlayer insulating layers 130. As an example, the mask layer 140 may include oxide.

The dummy spacers 161 and 162 may be a pair of spacers having inner side surfaces facing each other. For example, the dummy spacers 161 and 162 may include outer spacers 161 and inner spacers 162. The outer spacers 161 may be disposed closer to the gate structures G1, G2, G3, and G4 than the inner spacers 162. The dummy spacers 161 and 162 may be disposed over the first region P and the second region N. The dummy spacers 161 and 162 may be disposed between the first gate structure G1 and the second gate structure G2. In some embodiment, a plurality of dummy spacers 161 and 162 may be spaced apart from each other in the first direction. For example, a distance between the plurality of dummy spacers 161 and 162 in the first direction may be equal to a distance between each of the dummy spacers 161 and 162 and a gate structure, which is most adjacent thereto, in the first direction. The dummy spacers 161 and 162 may elongate in the second direction on the first active fin F1, the device isolation layer STI and DTI, and the second active fin F2. Outer sidewalls of the dummy spacers 161 and 162 may be in contact with the source and drain regions 120 and the interlayer insulating layer 130. In some embodiments, each of the dummy spacers 161 and 162 may extend in the second direction as illustrated in FIG. 1.

The first gate trenches GT1 may be disposed in the first region P. The first gate trenches GT1 may be disposed between the first gate structure G1 and the second gate structure G2. In some embodiments, a plurality of first gate trenches GT1 may be spaced apart from each other in the first direction. For instance, two first gate trenches GT1 may be spaced apart from each other in the first direction. Sidewalls of the first gate trench GT1 may be defined by portions of the dummy spacers 161 and 162, which are disposed in the first region P. A bottom surface of the first gate trench GT1 may be defined by the device isolation layer STI and DTI. The first gate trench GT1 may elongate on the device isolation layer STI and DTI along the dummy spacers 161 and 162 in the second direction.

First fin recesses FR1 may be disposed in the first region P. The first fin recesses FR1 may be disposed between the first gate structure G1 and the second gate structure G2. In some embodiments, a plurality of first fin recesses FR1 may be spaced apart from each other in the first direction and the second direction. For example, the first fin recesses FR1 may be respectively spaced apart from the first active fins F1 in the first direction, which are spaced apart from each other in the second direction. Sidewalls of the first fin recesses FR1 may be in contact with short sides of the first active fins F1. The sidewalls of the first fin recess FR1 may be defined by the first active fins F1. In some embodiments, the sidewalls of the first fin recess FR1 may be defined by the first active region AR1 and the first active fin F1. The first fin recesses FR1 may expose the first active fins F1. The first fin recess FR1 may be disposed under the first gate trench GT1. The first fin recess FR1 may be overlapped by the first gate trench GT1 from viewed from above. The first fin recess FR1 may be formed by extending a portion of the first gate trench GT1 downward. The first fin recess FR1 may be integrally formed with the first gate trench GT1 to form an integral trench space. In some embodiments, the first fin recess FR1 may be connected to the first gate trench GT1, and the first fin recess FR1 and the first gate trench GT1 may form a single space as illustrated in FIG. 2A.

A single diffusion break region SDB may be disposed inside the first gate trench GT1 and the first fin recess FR1 in the first region P. The single diffusion break region SDB may fill the first gate trench GT1 and the first fin recess FR1. The single diffusion break region SDB may be in contact with the first active fin F1 and the first active region AR1, which are exposed by the first fin recess FR1. The single diffusion break region SDB may be in contact with the device isolation layer STI and DTI and the dummy spacers 161 and 162. The single diffusion break region SDB may be inside the first gate trench GT1 and may extend in the third direction so that an upper portion of the single diffusion break region SDB may be interposed between the mask layers 140. In some embodiments, the single diffusion break region SDB may include a compressive stress material. The compressive stress material may be a material capable of applying compressive stress to a PMOS region. For example, the single diffusion break region SDB may include silicon nitride. As shown in FIG. 2A, a pair of single diffusion break regions SDB, which may be formed by replacing two gate structures, may be referred to as a "multiple diffusion break region."

A second fin recess FR2 may be disposed in the second region N. The second fin recess FR2 may be disposed between the first gate structure G1 and the second gate structure G2. Sidewalls of the second fin recess FR2 may be in contact with short sides of the second active fins F2. The sidewalls of the second fin recess FR2 may be defined by the second active fin F2 and the device isolation layer STI and DTI. In some embodiments, the sidewalls of the second fin recess FR2 may be defined by the second active region AR2, the second active fin F2, and the device isolation layer STI and DTI. The second fin recess FR2 may expose the second active fins F2. A width of the second fin recess FR2 in the first direction may be less than a distance between outer sidewalls of the outer spacers 161 of two adjacent dummy spacers 161 and 162. Further, the width of the second fin recess FR2 in the first direction may be greater than a distance between outer sidewalls of the inner spacers 162 of two adjacent dummy spacers 161 and 162. As shown in FIG. 2A, a lower end of the second fin recess FR2 may be at a different level from a lower end of the first fin recess FR1. For example, the lower end of the second fin recess FR2 may be at a lower level than the lower end of the first fin recess FR1. However, the inventive concept is not limited thereto, and the lower end of the second fin recess FR2 may be at a level lower than or corresponding to the lower end of the first fin recess FR1.

The lower diffusion break region DB1 may be inside the second fin recess FR2 in the second region N. The lower diffusion break region DB1 may fill the second fin recess FR2. The lower diffusion break region DB1 may be in contact with the second active fin F2 and the second active region AR2, which are exposed by the second fin recess FR2. The lower diffusion break region DB1 may be in contact with the device isolation layer STI and DTI. The inner spacers 162 of the dummy spacers 161 and 162 may be disposed on the lower diffusion break region DB1. Further, the interlayer insulating layer 130 disposed between the inner spacers 162 may be disposed on the lower diffusion break region DB1. In some embodiments, a top surface of the lower diffusion break region DB1 may be at the same level as the upper ends of the active fins F1 and F2. However, the inventive concept is not limited thereto, and the top surface of the lower diffusion break region DB1 may be at a lower or upper level than the upper ends of the active fins F1 and F2. In some embodiments, the lower diffusion break region DB1 may include a tensile stress material. The tensile stress material may be a material capable of applying tensile stress to an NMOS region. For example, the lower diffusion break region DB1 may include oxide such as tetraethyl orthosilicate (TEOS).

Second gate trenches GT2 may be disposed in the second region N. The second gate trenches GT2 and the first gate trenches GT1 may be disposed in a straight line in the second direction. In some embodiments, one of the second gate trenches GT2 and one of the first gate trenches GT1 may be aligned along the second direction. In some embodiments, a plurality of second gate trenches GT2 may be spaced apart from each other in the first direction. For example, two second gate trenches GT2 may be spaced apart from each other in the first direction. The second gate trench GT2 may extend on the second active fin F2, the lower diffusion break region DB1, and the device isolation layer STI and DTI along the dummy spacers 161 and 162 in the second direction. Sidewalls of the second gate trench GT2 may be defined by portions of the dummy spacers 161 and 162, which are disposed in the second region N. A bottom surface of the second gate trench GT2 may be defined by the second active fin F2 and the lower diffusion break region DB1. Further, the bottom surface of the second gate trench GT2 may be defined by the device isolation layer STI and DTI. In some embodiments, the bottom surface of the second gate trench GT2 may have a shape protruding upward due to the lower diffusion break region DB1. In some embodiments, the bottom surface of the second gate trench GT2 may be at a different level than the bottom surface of the first gate trench GT1. For example, the bottom surface of the second gate trench GT2 may be at a higher level than the bottom surface of the first gate trench GT1. The second gate trench GT2 and the first gate trench GT1, which are placed in a straight line in the second direction, may be integrally formed with each other to form an integral trench space. In some embodiments, the second gate trench GT2 may be connected to the first gate trench GT1, and the second gate trench GT2 and the first gate trench GT1 may form a single trench space as illustrated in FIG. 2B. A step difference may be formed at a portion of the second gate trench GT2, which is connected to the first gate trench GT1.

The upper diffusion break region DB2 may be disposed inside the second gate trenches GT2 in the second region N. The upper diffusion break region DB2 may fill the second gate trench GT2. The upper diffusion break region DB2 may elongate in the second direction and disposed along with the single diffusion break region SDB in a straight line in the second direction. In some embodiments, the upper diffusion break region DB2 and the single diffusion break region SDB are aligned along the second direction as illustrated in FIG. 1. Side surfaces of the upper diffusion break region DB2 may be in contact with the dummy spacers 161 and 162. A bottom surface of the upper diffusion break region DB2 may be in contact with the second active fin F2, the lower diffusion break region DB1, and the device isolation layer STI and DTI. In some embodiments, the upper diffusion break region DB2 may cover a portion of an upper portion of the lower diffusion break region DB1. The upper diffusion break region DB2 may extend upward from the inside of the second gate trench GT2 so that an upper portion of the upper diffusion break region DB2 may be interposed between the mask layers 140. For example, a top surface of the upper diffusion break region DB2 may be at the same level as a top surface of the mask layer 140.

In some embodiments, one side surface of the upper diffusion break region DB2 may be in contact with another side surface of the single diffusion break region SDB. Since the single diffusion break region SDB is in contact with the upper diffusion break region DB2, voids may not be formed between the single diffusion break region SDB and the upper diffusion break region DB2. In some embodiments, a side surface of the upper diffusion break region DB2 may contact a side surface of the single diffusion break region SDB, as illustrated in FIG. 2B. In some embodiments, the upper diffusion break region DB2 may include a tensile stress material. The tensile stress material may be a material capable of applying tensile stress to an NMOS region. For example, the lower diffusion break region DB1 may include an oxide formed using an atomic layer deposition (ALD) process. The lower diffusion break region DB1 may include the same material as the upper diffusion break region DB2.

Figure 2C:
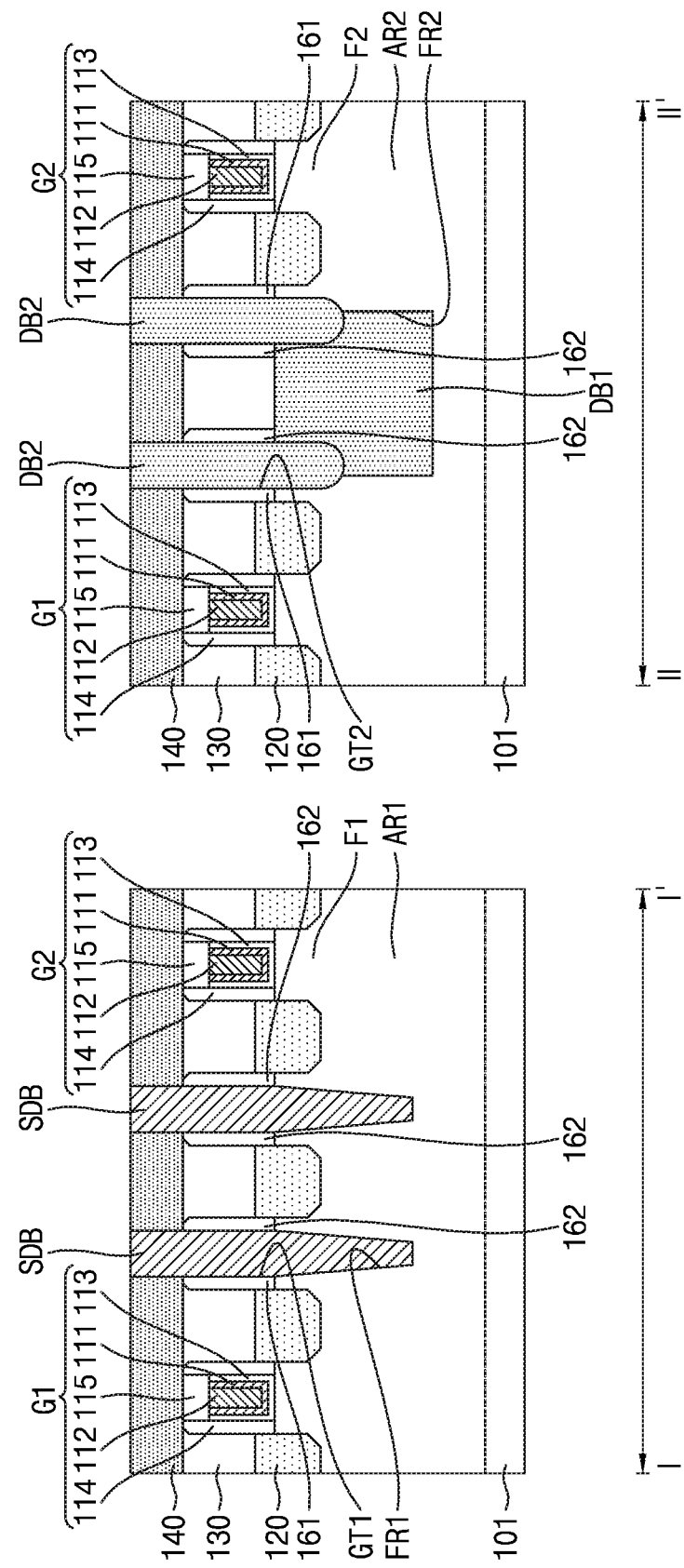
FIG. 2C shows vertical cross-sectional views taken along the lines I-I' and II-IF of FIG. 1 according to some embodiments of the inventive concept.

FIG. 2C shows vertical cross-sectional views taken along the lines I-I' and II-IF of FIG. 1, according to some embodiments. Hereinafter, the same descriptions as in FIGS. 1 to 2B may be omitted for brevity.

Referring to FIG. 2C, an upper diffusion break region DB2 may extend downward so that a bottom end of the upper diffusion break region DB2 may be at a lower level than a top surface of a lower diffusion break region DB1. A lower portion of the upper diffusion break region DB2 of FIG. 2C may extend to a lower level than a top end of a second active fin F2 so that a contact area between the upper diffusion break region DB2 and the lower diffusion break region DB1 may increase.

Figure 3:
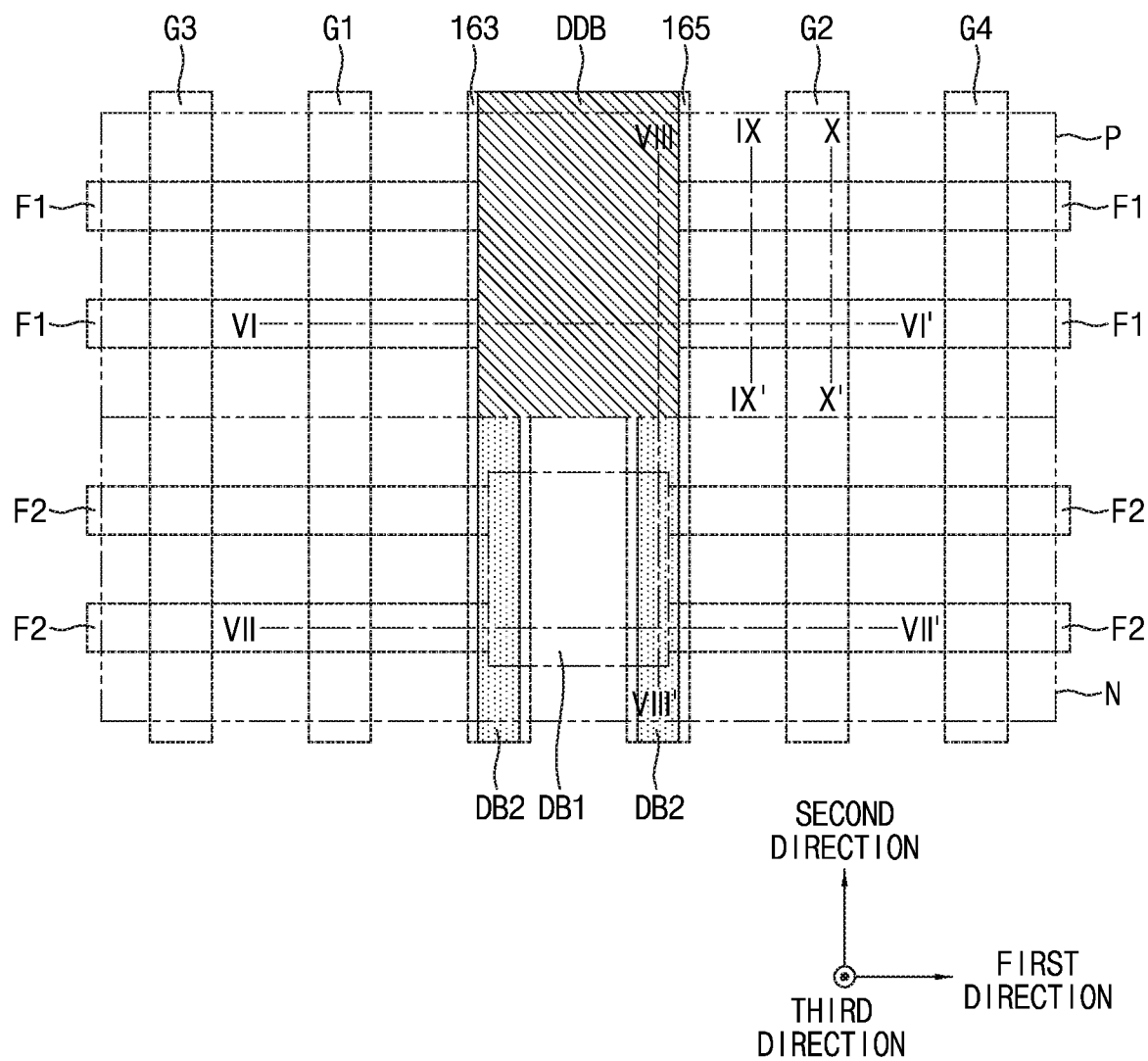
FIG. 3 schematically illustrates a layout of a partial region of a semiconductor device according to some embodiments of the inventive concept.
Figure 4A:
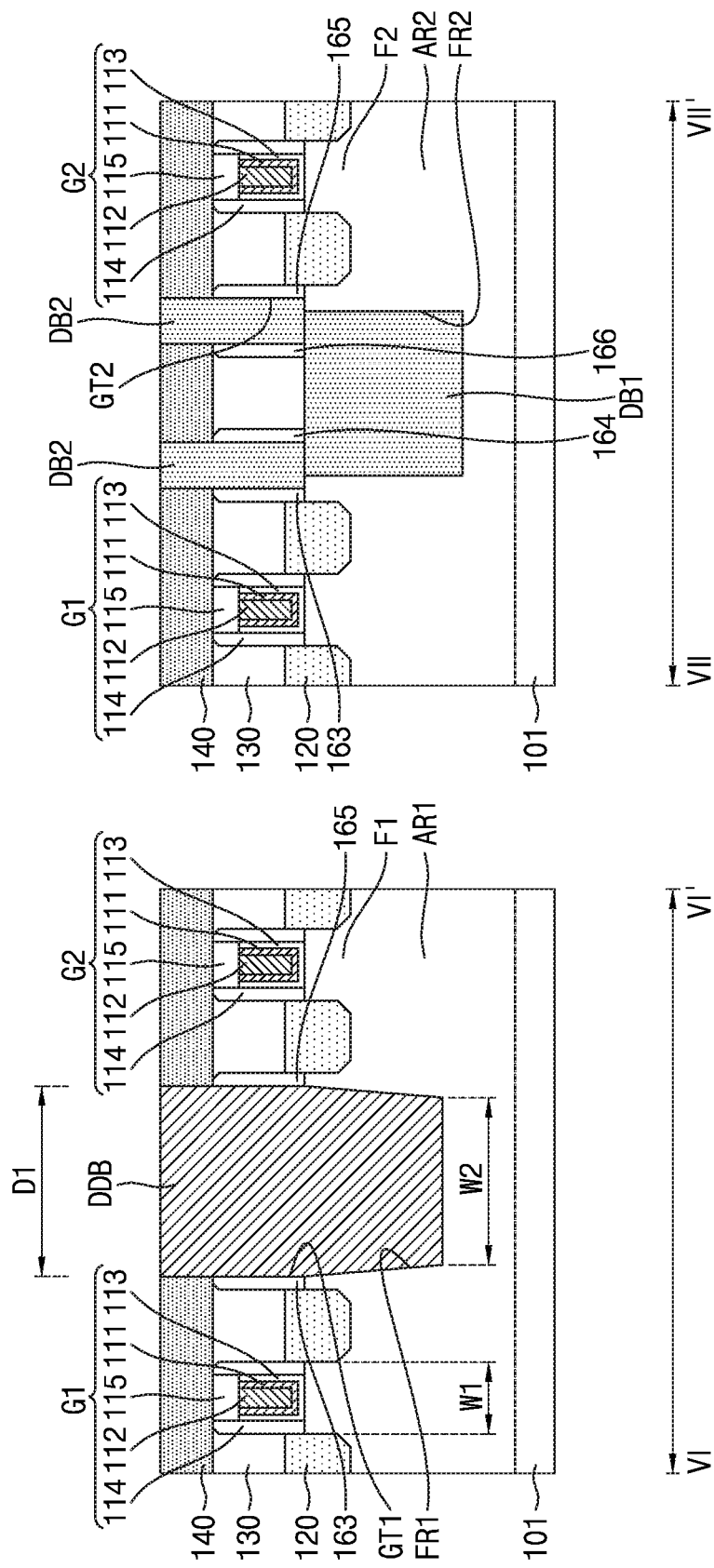
FIG. 4A shows vertical cross-sectional views taken along lines VI-VI' and VII-VII' of FIG. 3 according to some embodiments of the inventive concept.
Figure 4B:
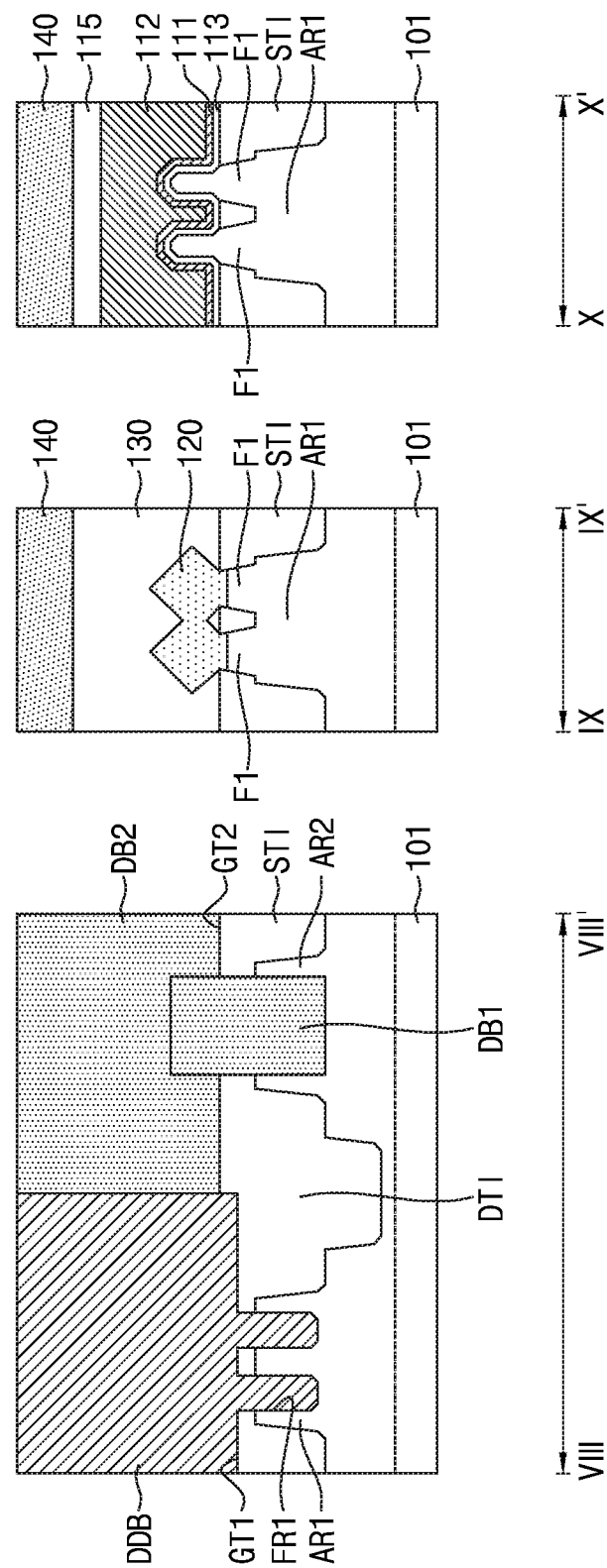
FIG. 4B shows vertical cross-sectional views taken along lines VIII-VIII', IX-IX', and X-X' of FIG. 3 according to some embodiments of the inventive concept.
Figure 4C:
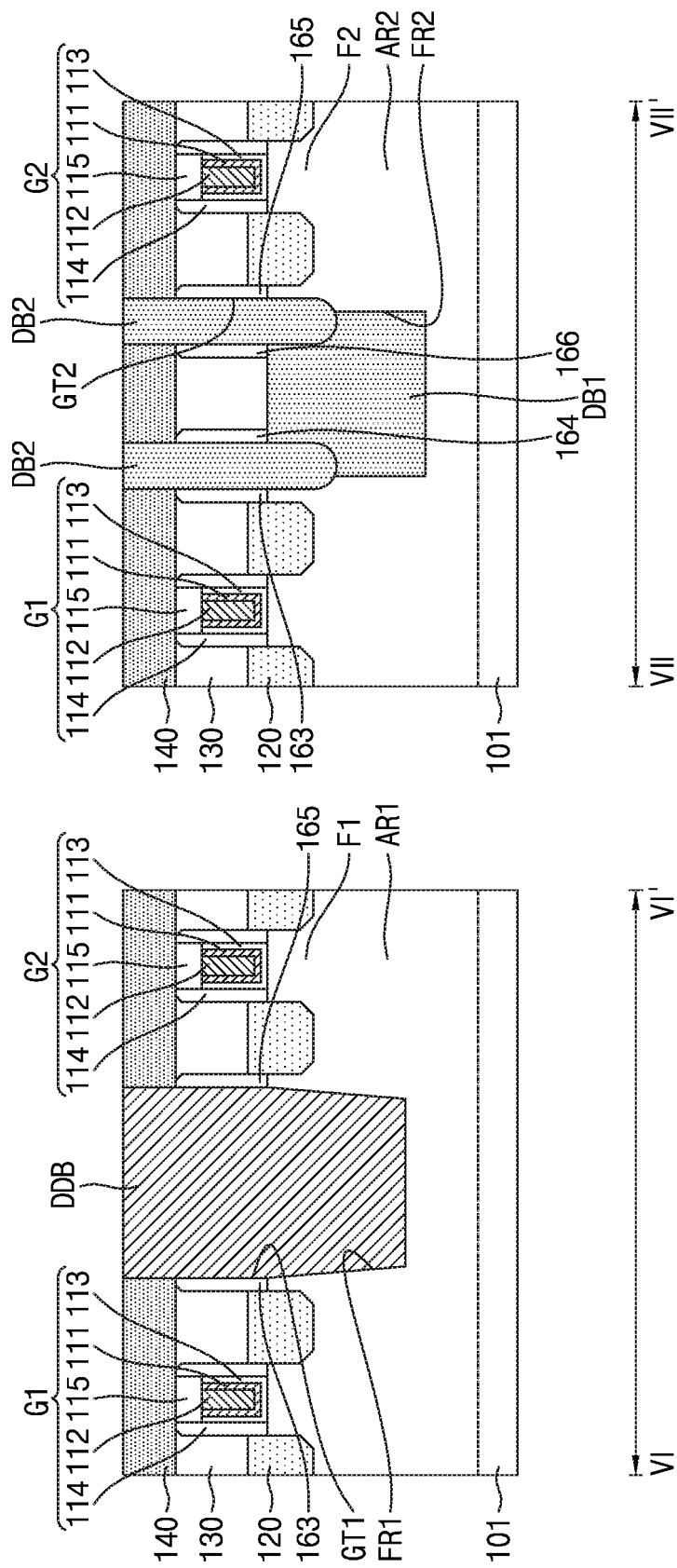
FIGS. 4C and 4D show vertical cross-sectional views taken along lines VI-VI' and VII-VII' of FIG. 3 according to some embodiments of the inventive concept.
Figure 4D:
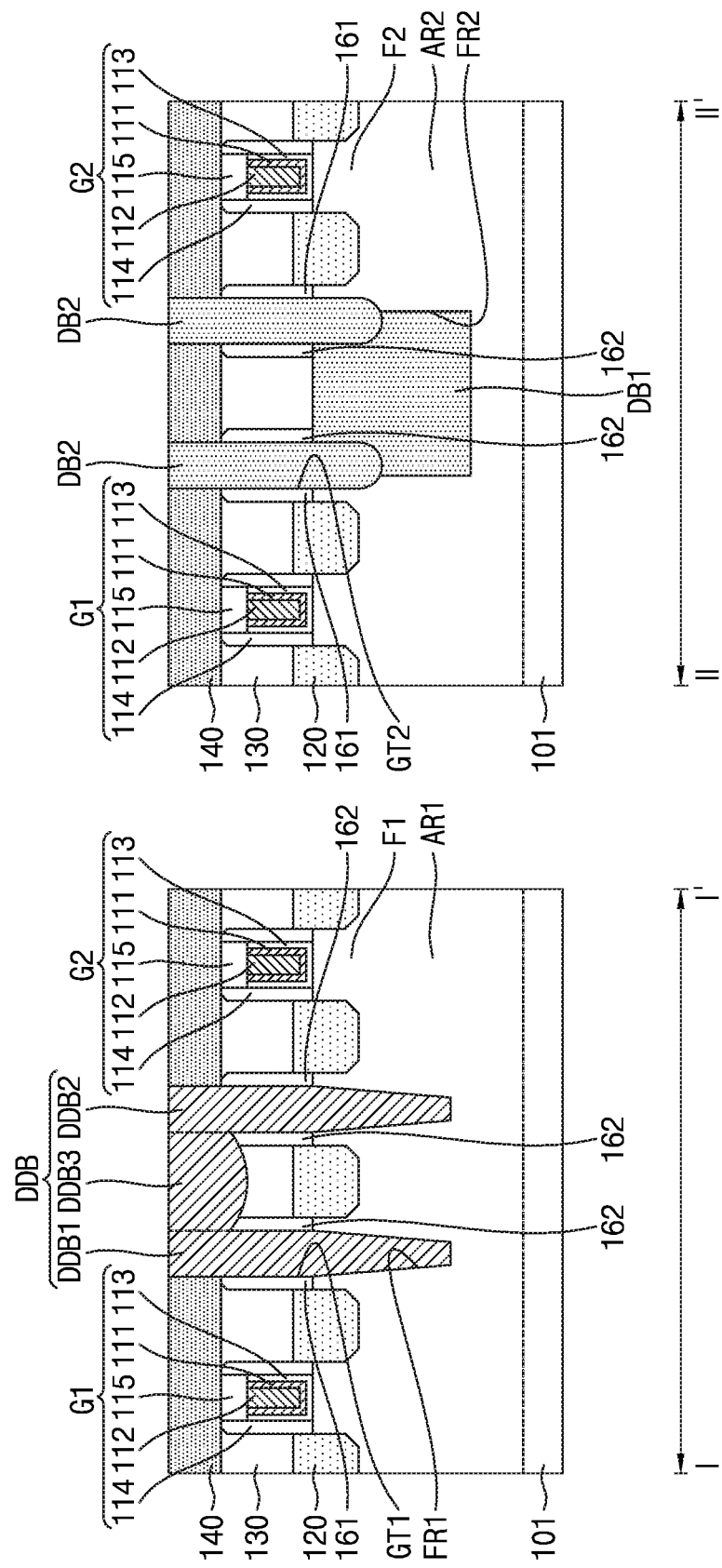

FIG. 3 schematically illustrates a layout of a partial region of a semiconductor device according to some embodiments of the inventive concept. FIG. 4A shows vertical cross-sectional views taken along lines VI-VI' and VII-VII' of FIG. 3 according to some embodiments of the inventive concept. FIG. 4B shows vertical cross-sectional views taken along lines VIII-VIII', IX-IX', and X-X' of FIG. 3 according to some embodiments of the inventive concept. FIGS. 4C and 4D show vertical cross-sectional views taken along lines VI-VI' and VII-VII' of FIG. 3 according to some embodiments of the inventive concept. Hereinafter, the same descriptions as in FIGS. 1 to 2C may be omitted for brevity.

Referring to FIGS. 3 to 4B, a semiconductor device 200 may include a first fin recess FR1, dummy spacers 163, 164, 165, and 166, a first gate trench GT1, and a double diffusion break region DDB that may have a large width in a first direction in a first region P.

The first fin recess FR1 may be disposed between a first gate structure G1 and a second gate structure G2. Sidewalls of the first fin recesses FR1 may be in contact with short sides of first active fins F1. The sidewalls of the first fin recess FR1 may be defined by the first active fin F1. In some embodiments, the sidewalls of the first fin recess FR1 may be defined by a first active region AR1 and the first active fin F1. In some embodiments, a width of a bottom surface of the first fin recess FR1 may be at least twice of a distance between outer sidewalls of gate spacers 114. For example, the first fin recess FR1 may be formed by extending the plurality of first fin recesses FR1 shown in FIG. 2A in the first direction and integrating (e.g., merging) the plurality of first fin recesses FR1 with each other. Each of the first gate structure G1 and the second gate structure G2 may have a first width W1 in the first direction, two dummy spacers 163 and 165 may be spaced apart from each other by a first distance DI in the first direction, and the bottom surface of the first fin recess FR1 may have a second width W2 in the first direction. In some embodiments, each of the first distance DI and the second width W2 may be at least twice of the first width W1, as illustrated in FIG. 4A.

The dummy spacers 163, 164, 165, and 166 may include outer spacers 163 and 165 and inner spacers 164 and 166. The outer spacers 163 and 165 may elongate over the first region P and the second region N in a second direction. The inner spacers 164 and 166 may elongate only in the second region N in the second direction. The inner spacers 164 and 166 may not be disposed in the first region P. The dummy spacers 163 and 165 disposed in the first region P may include a pair of outer spacers. The dummy spacers 163, 164, 165, and 166 disposed in the second region N may include a pair of outer spacers 163 and 165 and a pair of inner spacers 164 and 166. The outer spacers 163 and 165 disposed in the first region P may be disposed in the first active fin F1 and the device isolation layer STI and DTI. In some embodiments, the first distance DI between the outer spacers 163 and 165 disposed in the first region P (e.g., a distance between sides of the outer spacers 163 and 165 in the first region P, which face each other, as illustrated in FIG. 4A) in the first direction may be greater than or equal to the second width W2 of the bottom surface of the first fin recess FR1 in the first direction. For example, the first distance DI between inner side surfaces of the outer spacers 163 and 165 may be at least twice of a distance between the outer sidewalls of the gate spacers 114 (e.g., the first width W1 of each of the first gate structure G1 and the second gate structure G2).

Sidewalls of the first gate trench GT1 may be defined by portions of the outer spacers 163 and 165, which are disposed in the first region P. The first gate trench GT1 may be in contact with other ends of the inner spacers 164 and 166 disposed in the second region N and another side surface of the interlayer insulating layer 130 disposed between the inner spacers 164 and 166. A bottom surface of the first gate trench GT1 may be defined by the device isolation layer STI and DTI. The first gate trench GT1 may extend on the device isolation layer STI and DTI along the dummy spacers 163 and 165 in the second direction. For example, the first gate trench GT1 may be formed by extending the plurality of first gate trenches GT1 shown in FIG. 2A in the first direction and integrating the plurality of first gate trenches GT1 with each other. The first gate trench GT1 may be integrally formed with the first fin recess FR1 to form an integral space. The first fin recess FR1 may be formed by extending a portion of the first gate trench GT1 downward. In some embodiments, the first gate trench GT1 may be connected to the first fin recess FR1, and the first gate trench GT1 and the first fin recess FR1 may form a single space as illustrated in FIG. 4A.

The double diffusion break region DDB may be disposed inside the first fin recess FR1 and the first gate trench GT1. The double diffusion break region DDB may fill the first fin recess FR1 and the first gate trench GT1. In some embodiments, one side surface of the double diffusion break region DDB may be in contact with another side surface of an upper diffusion break region DB2 disposed in the second region N. In some embodiments, although not shown, one side surface of the double diffusion break region DDB may be in contact with another side surface of a lower diffusion break region DB1 disposed in the second region N. As used herein, the double diffusion break region DDB may be called as a "multiple diffusion break region."

Referring to FIG. 4C, an upper diffusion break region DB2 may extend downward so that a bottom end of the upper diffusion break region DB2 may be at a lower level than a top surface of a lower diffusion break region DB1. A lower portion of the upper diffusion break regions DB2 of FIG. 4C may extend to a lower level than a top end of a second active fin F2 so that a contact area between the upper diffusion break region DB2 and the lower diffusion break region DB1 may increase, as shown in FIG. 2C.

Referring to FIG. 4D, in some embodiments, the double diffusion break region DDB may include a first double diffusion break region DDB1, a second double diffusion break region DDB2, and a third double diffusion break region DDB3. The first double diffusion break region DDB1 and the second double diffusion break region DDB2 may be disposed between dummy spacers 161 and 162 and extend between first active fins F1. The third double diffusion break region DDB3 may be disposed between the first double diffusion break region DDB1 and the second double diffusion break region DDB2. In some embodiments, a bottom surface of the third double diffusion break region DDB3 may be at a higher level than a top end of a first active fin F1. In some embodiments, the bottom surface of the third double diffusion break region DDB3 may be at a lower level than the top end of the first active fin F1.

FIGS. 5A to 10B are vertical cross-sectional views illustrating a method of manufacturing a semiconductor device according to some embodiments of the inventive concept. FIGS. 5A, 6A, 7A, 8A, 9A, and 10A show vertical cross-sectional views taken along the lines I-I' and II-IF of FIG. 1 according to some embodiments of the inventive concept. FIGS. 5B, 6B, 7B, 8B, 9B, and 10B show vertical cross-sectional views taken along the line of FIG. 1 according to some embodiments of the inventive concept. Hereinafter, the same descriptions as in FIGS. 1 to 4B may be omitted for brevity.

Figure 5A:
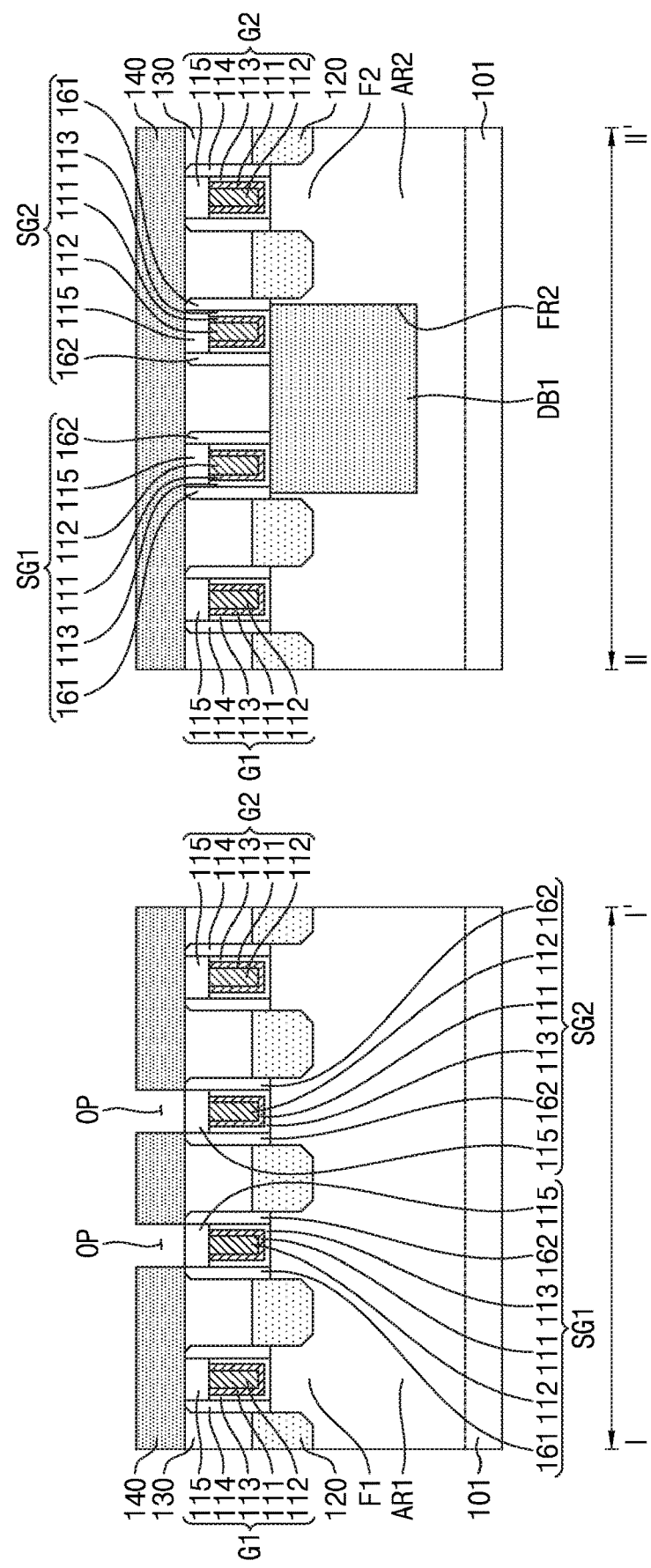
FIGS. 5A, 5B, 6A, 6B, 7A, 7B, 8A, 8B, 9A, 9B, 10A, and 10B are vertical cross-sectional views illustrating a method of manufacturing a semiconductor device according to some embodiments of the inventive concept.
Figure 5B:
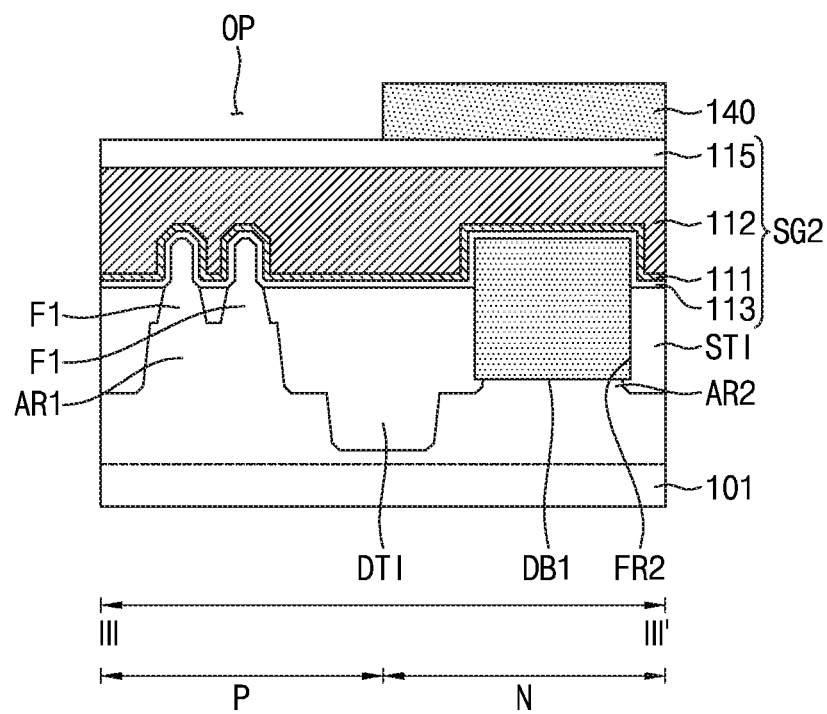

FIGS. 5A and 5B illustrate semiconductor devices on which processes from a process of forming active fins F1 and F2 on a substrate 101 to a gate replacement process are completed. For example, active regions AR1 and AR2 and active fins F1 and F2 may be formed on a substrate 101 including a first region P and a second region N, and a device isolation layer ST1 and DT1 may be formed to surround the vicinities of the active regions AR1 and AR2 and the active fins F1 and F2. The active region AR2, the active fins F2, and the device isolation layer STI and DT1 may be partially etched in the second region of the substrate 101, thereby forming a second fin recess region FR2. The second fin recess region FR2 may be filled by a lower diffusion break region DB1. A dummy gate structure (not shown), source and drain regions 120, and an interlayer insulating layer 130 may be formed on the active fins F1 and F2, the device isolation layer STI and DTI and the lower diffusion break region DB1. A gate replacement process may be performed to replace the dummy gate structure.

Referring to FIGS. 5A and 5B, the semiconductor device on which the gate replacement process has been performed may include a first region P and a second region N. For instance, the first region P may be a PMOS region, and the second region N may be an NMOS region. The semiconductor device may include active regions AR1 and AR2, active fins F1 and F2, gate structures G1, G2, G3, and G4, sacrificial gate structures SG1 and SG2, source and drain regions 120, a shallow device isolation layer STI, a deep device isolation layer DTI, and an interlayer insulating layer 130 on the substrate 101 in the first region P and the second region N. The semiconductor device may further include the lower diffusion break region DB1 in the second region N.

The sacrificial gate structures SG1 and SG2 may be disposed between the first gate structure G1 and the second gate structure G2. A mask layer 140 may be formed on the gate structures G1, G2, G3, and G4, the sacrificial gate structures SG1 and SG2, and the interlayer insulating layer 130. The mask layer 140 may include an open region OP in the first region P. Although not shown, a photoresist film may be formed on the mask layer 140 in the first region P. For example, the photoresist film may be formed to be aligned with sidewalls of spacers of the sacrificial gate structures SG1 and SG2. The open region OP of the mask layer 140 may be formed by etching a portion of the mask layer 140 using the photoresist film as an etch mask. Top surfaces of the sacrificial gate structures SG1 and SG2 may be exposed by the open region OP of the mask layer 140. After the open region OP is formed, the photoresist film may be removed.

Figure 6A:
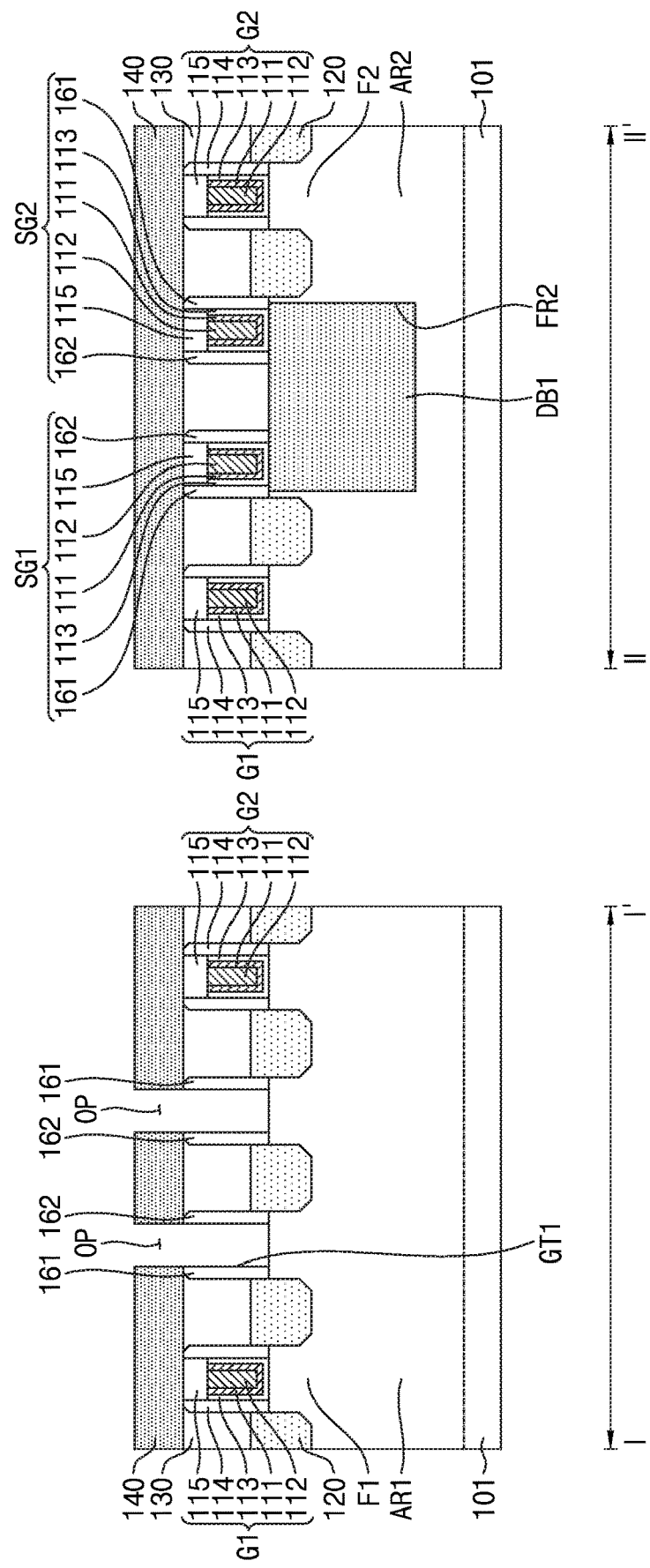
Figure 6B:
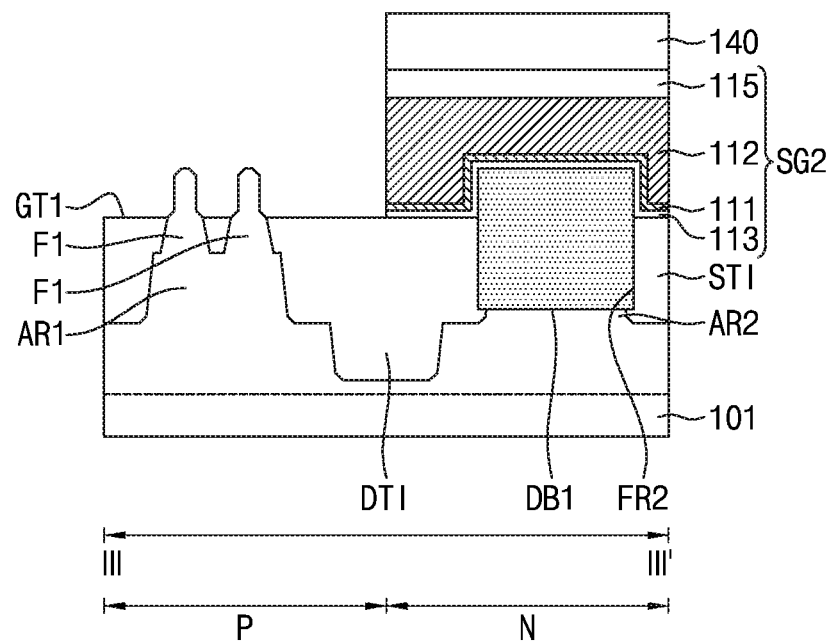

Referring to FIGS. 6A and 6B, a gate capping layer 115, a gate electrode 111 and 112, and a gate insulating layer 113 of the sacrificial gate structures SG1 and SG2 may be sequentially etched and removed through the open region OP. The gate capping layer 115, the gate electrode 111 and 112, and the gate insulating layer 113 may be removed to form a first gate trench GT1. Sidewalls of dummy spacers 161 and 162 and upper portions of the fin active fins F1 may be exposed by the first gate trench GT1. Further, a top surface of the device isolation layer STI and DTI may be exposed by the first gate trench GT1. For example, the gate capping layer 115, the gate electrode 111 and 112, and the gate insulating layer 113 may be removed using an anisotropic etching process and/or an isotropic etching process. The etching processes may be performed using etching materials having high selectivities with respect to the gate capping layer 115, the gate electrode 111 and 112, and the gate insulating layer 113.

Figure 7A:
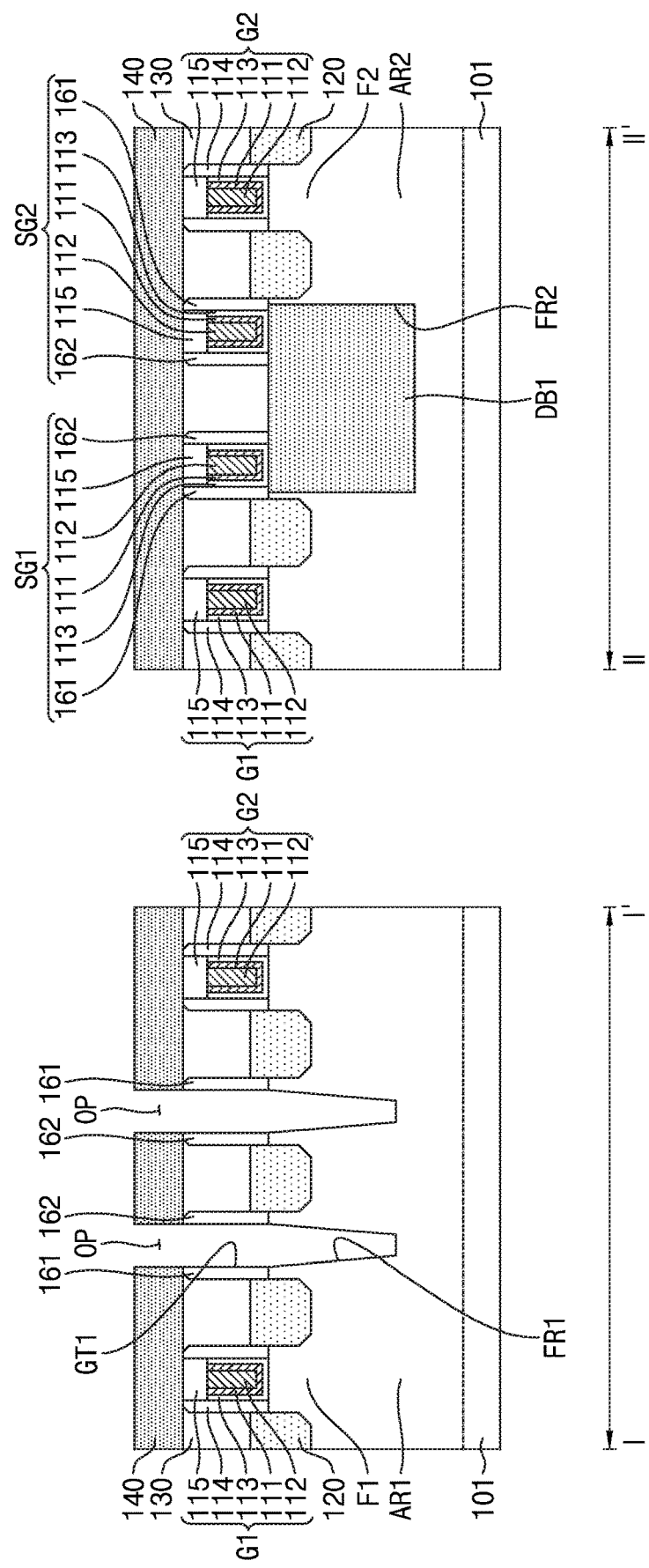
Figure 7B:
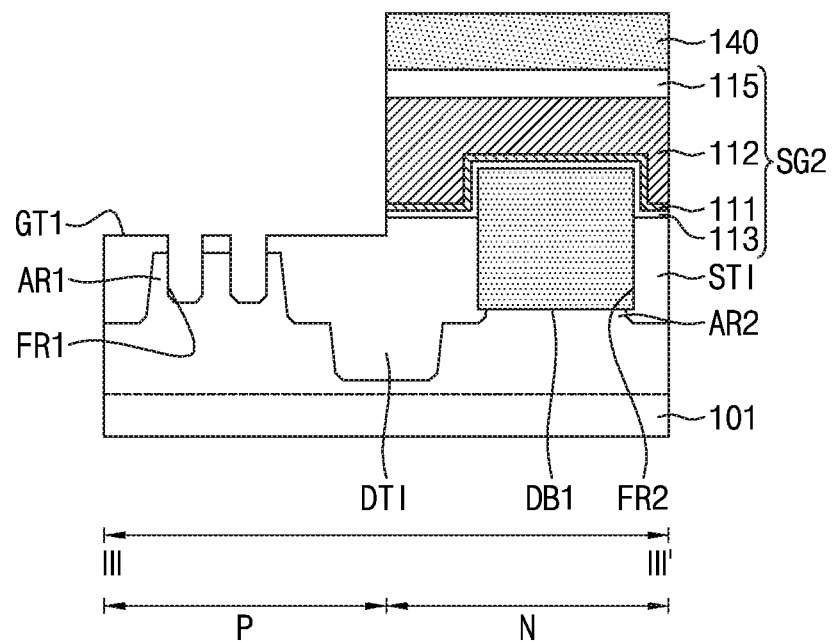

Referring to FIGS. 7A and 7B, the first active fins F1 of which the upper portions are exposed by the first gate trench GT1 may be etched in the first region P to form a first fin recess FR1. That is, the first fin recess FR1 may be formed by extending a portion of the first gate trench GT1 downward. A bottom end of the first fin recess FR1 may be at a different level than a bottom end of the lower diffusion break region DB1. For example, the bottom end of the first fin recess FR1 may be at a lower level or a high level than the bottom end of the lower diffusion break region DB1. However, the inventive concept is not limited thereto, and the bottom end of the first fin recess FR1 may be at the same level as the bottom end of the lower diffusion break region DB1. The first fin recess FR1 may be integrally formed with the first gate trench GT1 to form an integrally connected space. In some embodiments, the first fin recess FR1 may be connected to the first gate trench GT1, and the first fin recess FR1 and the first gate trench GT1 may form a single space as illustrated in FIGS. 7A and 7B. During the formation of the first fin recess FR1, the device isolation layer STI and DTI disposed in the first region P may be partially etched so that a height of the top surface of the device isolation layer STI and DTI may be reduced. The top surface of the device isolation layer STI and DTI in the first region P may be at a lower level than the top surface of the device isolation layer STI and DTI in the second region N.

Figure 8A:
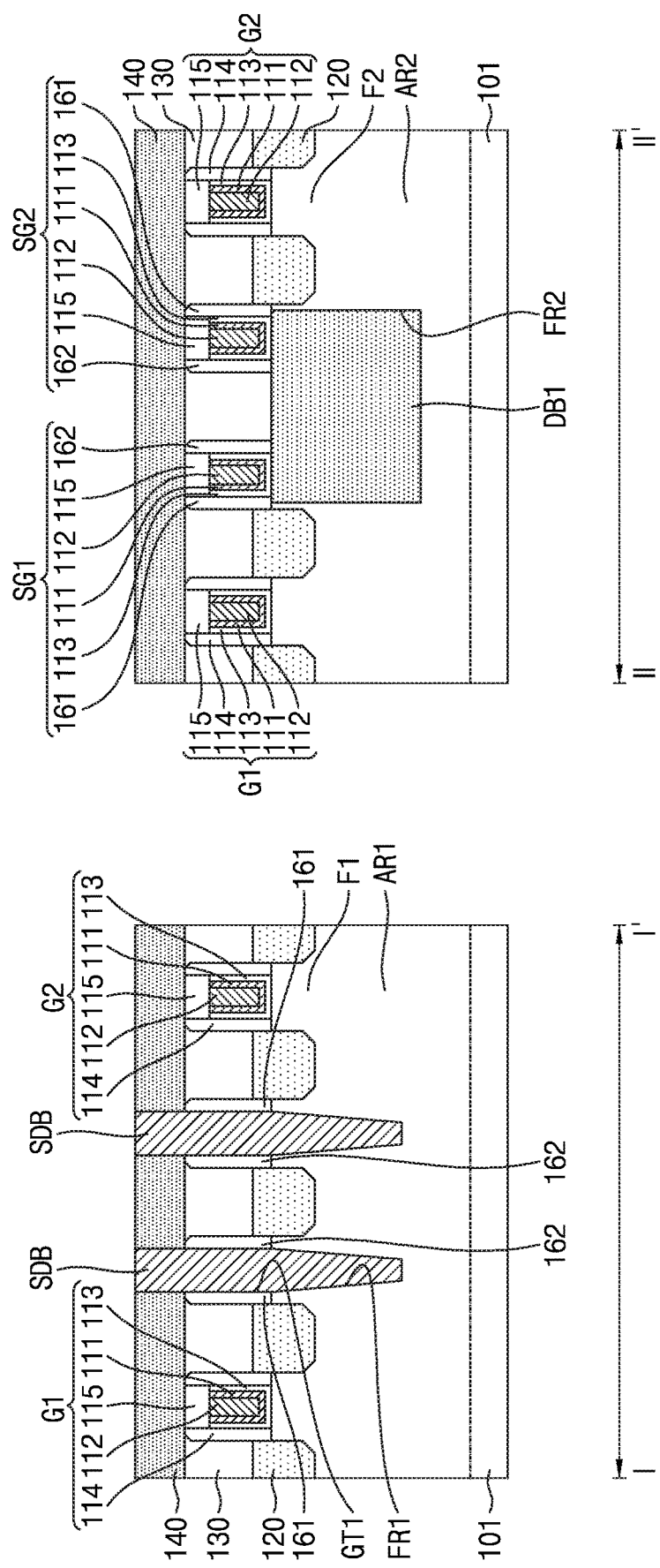
Figure 8B:
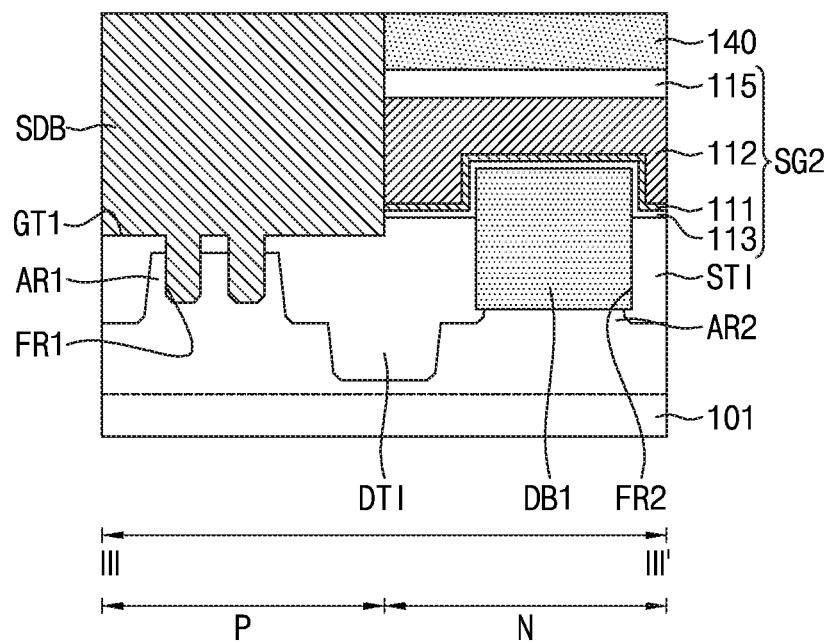

Referring to FIGS. 8A and 8B, a single diffusion break region SDB may be formed inside the first fin recess FR1 and the first gate trench GT1 in the first region P. The single diffusion break region SDB may fill (e.g., completely fill) the first fin recess FR1 and the first gate trench GT1. Further, the single diffusion break region SDB may fill the open region OP of the mask layer 140. One side surface of the single diffusion break region SDB may be in contact with other side surfaces of the sacrificial gate structures SG1 and SG2 in the second region N.

Figure 9A:
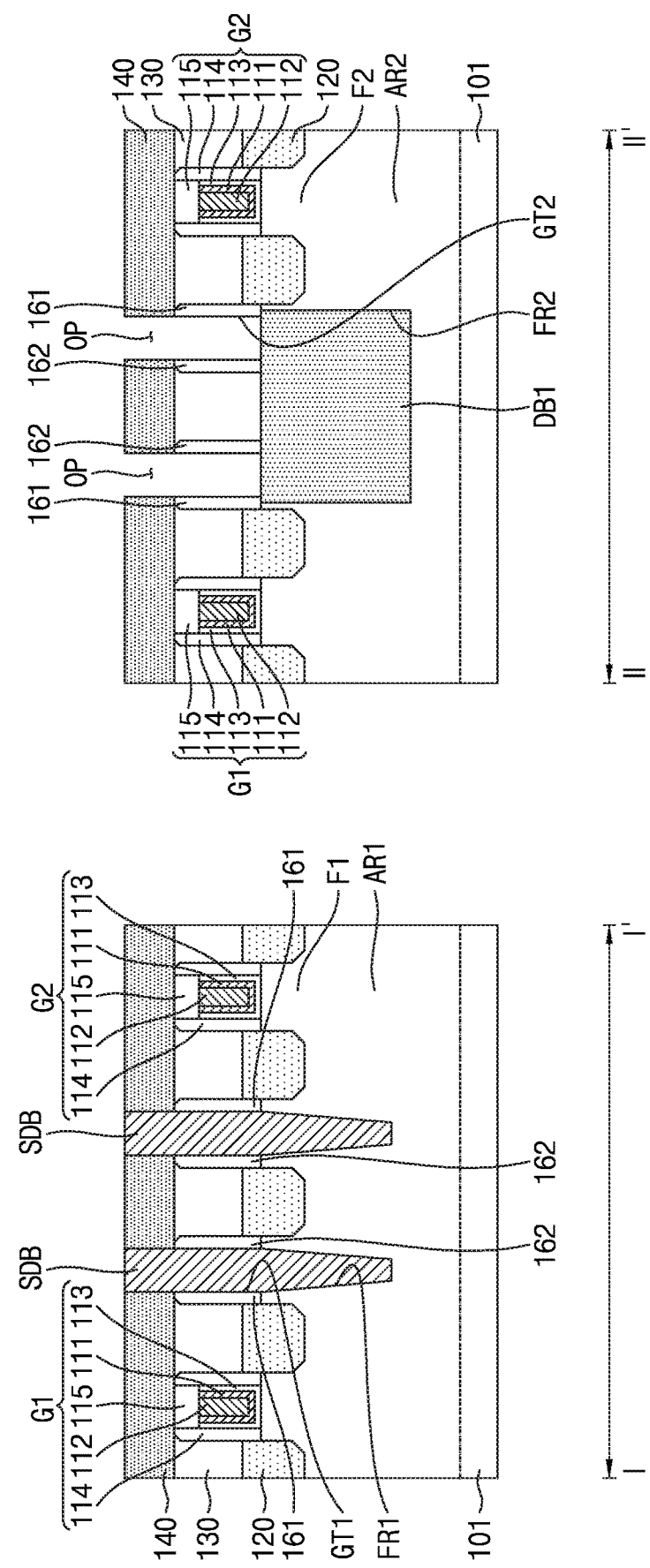
Figure 9B:
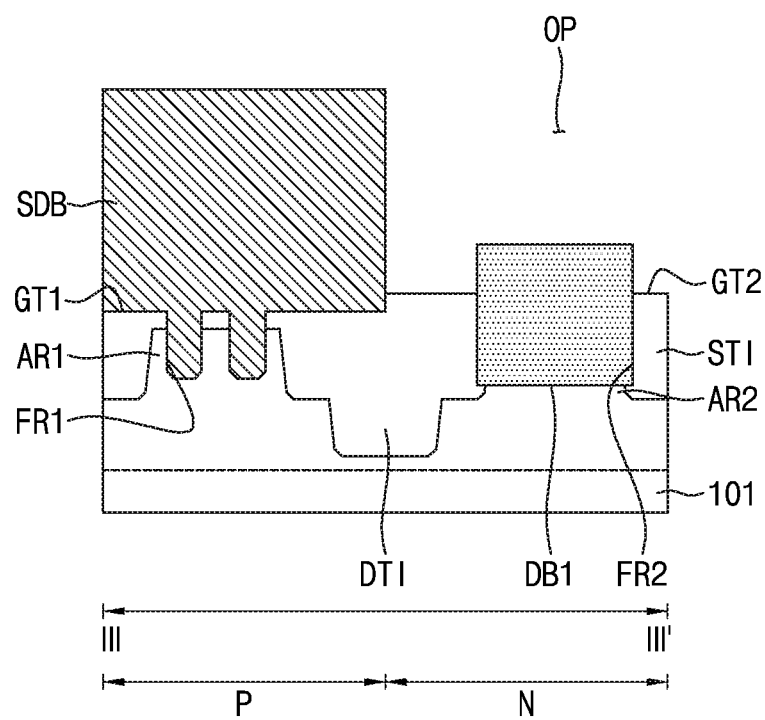

Referring to FIGS. 9A and 9B, the gate insulating layer 113, the gate electrode 111 and 112, and the gate capping layer 115 of the sacrificial gate structures SG1 and SG2 may be removed in the second region N. Although not shown, a photoresist film may be formed on the mask layer 140. The photoresist film may be formed to be aligned with the sidewalls of the spacers of the sacrificial gate structures SG1 and SG2 in the second region N. A portion of the mask layer 140 may be etched using the photoresist film as an etch mask in the second region N to form an open region OP. The top surfaces of the sacrificial gate structures SG1 and SG2 may be exposed by the open region OP. After the open region OP is formed, the photoresist film may be removed.

The gate capping layer 115, the gate electrode 111 and 112, and the gate insulating layer 113 of the sacrificial gate structures SG1 and SG2 may be sequentially removed through the open region OP in the second region N. The gate capping layer 115, the gate electrode 111 and 112, and the gate insulating layer 113 may be removed to form a second gate trench GT2. The second gate trench GT2 may expose sidewalls of the dummy spacers 161 and 162, an upper portion of the lower diffusion break region DB1, the top surface of the device isolation layer STI and DTI, and the side surfaces of the single diffusion break region SDB. The top surface of the device isolation layer ST1 and DTI exposed by the second gate trench GT2 may be at a higher level than or at the same level as the top surface of the device isolation layer STI and DTI in the first region P.

Figure 10A:
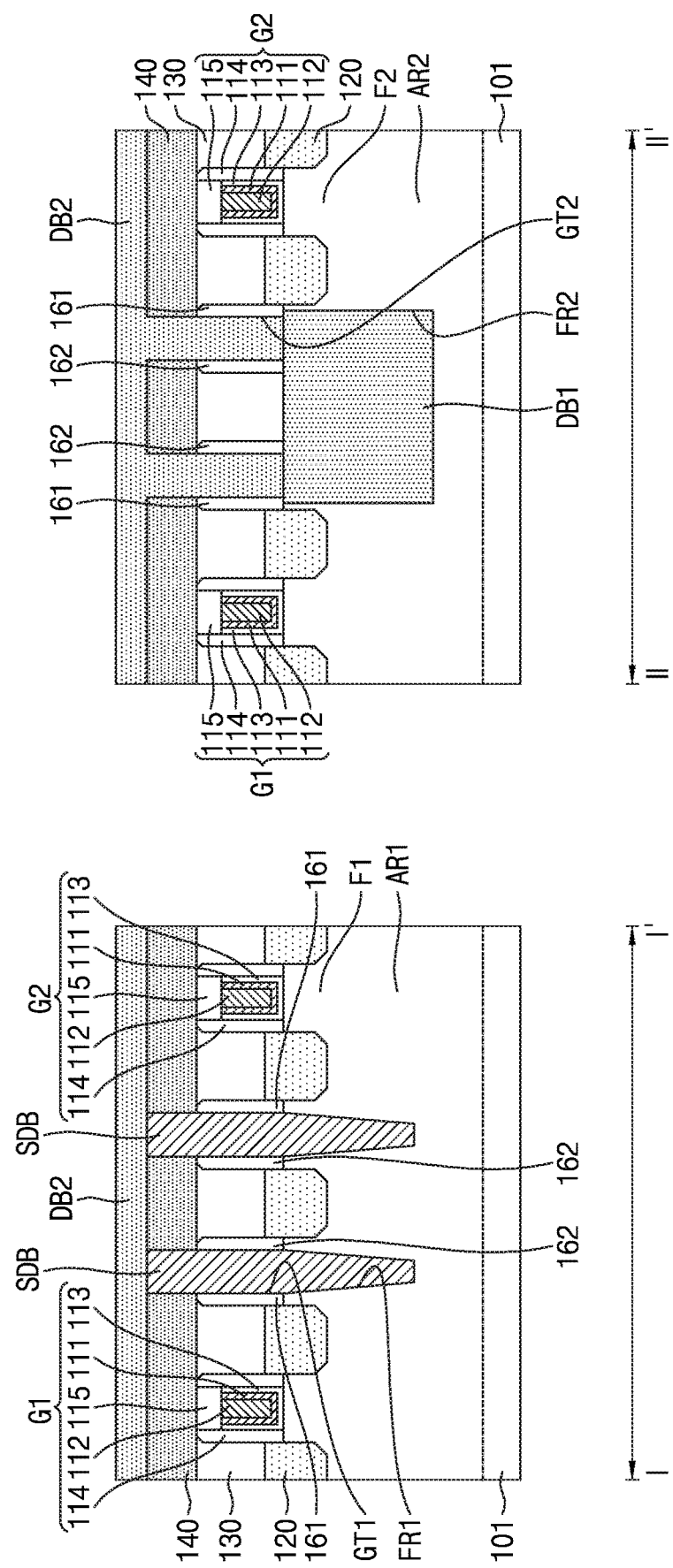
Figure 10B:
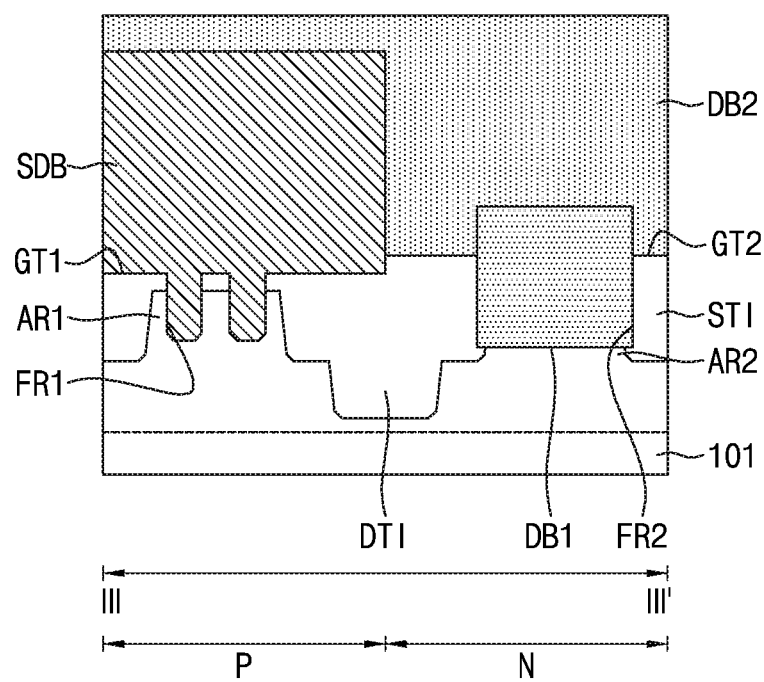

Referring to FIGS. 10A and 10B, an upper diffusion break region DB2 may be formed in the second region N. The upper diffusion break region DB2 may fill (e.g., completely fill) the second gate trench GT2. The upper diffusion break region DB2 may fill the open region OP of the mask layer 140. The upper diffusion break region DB2 may cover a top surface of the mask layer 140. The upper diffusion break region DB2 may cover an upper portion of the lower diffusion break region DB1. The upper diffusion break region DB2 may be in contact with the top surface of the device isolation layer STI and DTI. The upper diffusion break region DB2 may cover the single diffusion break region SDB. The upper diffusion break region DB2 may be in contact with one side surface of the single diffusion break region SDB. In some embodiments, the upper diffusion break region DB2 may be formed using an atomic layer deposition (ALD) process. After the upper diffusion break region DB2 is formed to fill the open region OP of the mask layer 140, the upper diffusion break region DB2 may be removed from the mask layer 140, and the top surface of the mask layer 140 may be exposed by, for example, a planarization process. Subsequently, an oxide layer may be formed to cover the exposed top surface of the mask layer 140.

Figure 11:
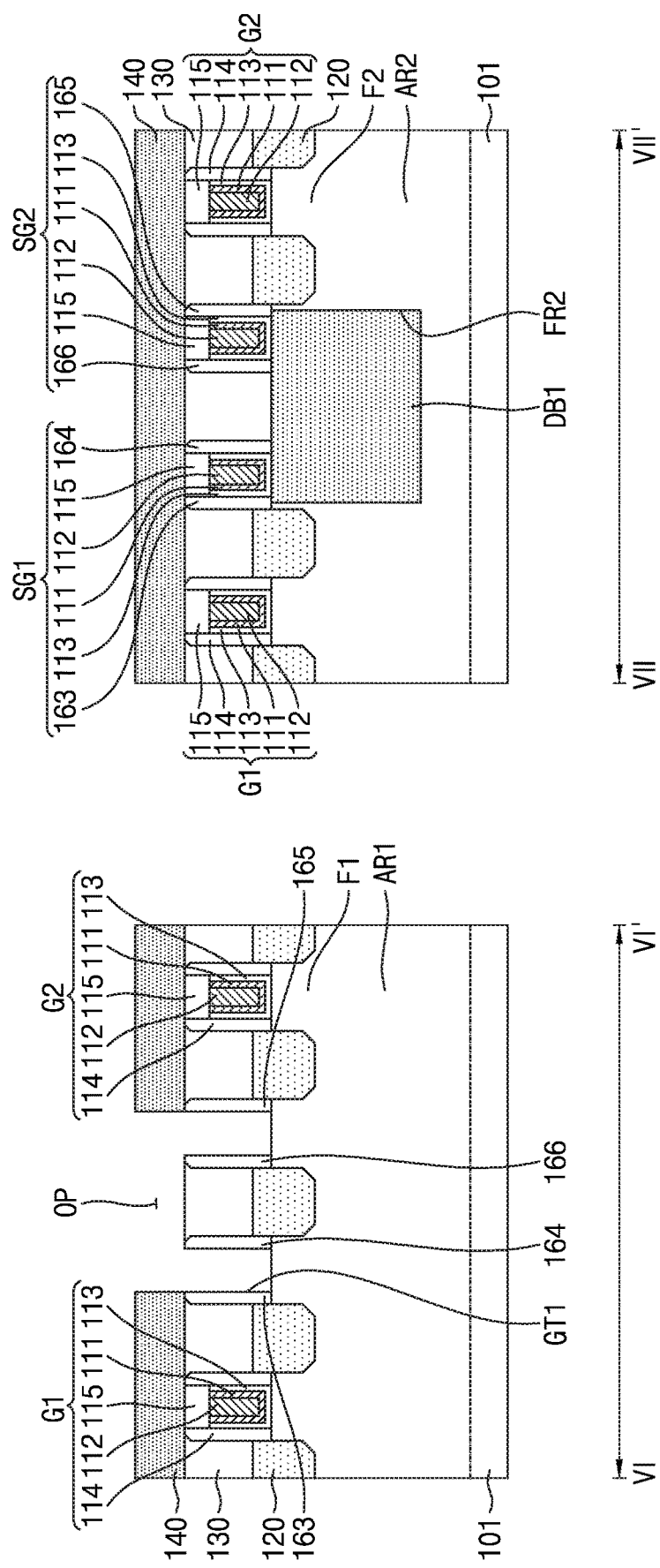
FIGS. 11 through 15 are vertical cross-sectional views illustrating a method of manufacturing a semiconductor device according to some embodiments of the inventive concept.

FIGS. 11 through 15 show vertical cross-sectional views illustrating a method of manufacturing a semiconductor device according to some embodiments of the inventive concept. Specifically, FIGS. 11 through 15 show vertical cross-sectional views taken along the lines VI-VI' and VII-VII' of FIG. 3 according to some embodiments of the inventive concept. FIG. 11 illustrates a semiconductor device on which processes from a process of forming active fins F1 and F2 on a substrate 101 to a gate replacement process are completed.

Referring to FIG. 11, the semiconductor device may include a first region P and a second region N. The semiconductor device may include active fins F1 and F2, gate structures, sacrificial gate structures SG1 and SG2, source and drain regions 120, and an interlayer insulating layer 130 on a substrate 101. The semiconductor device may further include a lower diffusion break region DB1 in the second region N.

A mask layer 140 may be formed on the gate structures G1 and G2, the sacrificial gate structures SG1 and SG2, and the interlayer insulating layer 130. Although not shown, a photoresist film may be formed on the mask layer 140 and aligned with one sidewall of a first sacrificial gate structure SG1 and another sidewall of a second sacrificial gate structure SG2. Portions of the mask layer 140 may be etched using the photoresist film as an etch mask, thereby forming open regions OP. Top surfaces of the sacrificial gate structures SG1 and SG2 and a top surface of the interlayer insulating layer 130 disposed between the sacrificial gate structures SG1 and SG2 may be exposed by the open regions OP.

A gate capping layer 115, a gate electrode 111 and 112, and a gate insulating layer 113 of the sacrificial gate structures SG1 and SG2 may be removed through the open regions OP to form first gate trenches GT1. Upper portions of the first active fins F1 and sidewalls of spacers 163, 164, 165, 166 may be exposed by the first gate trenches GT1.

Figure 12:
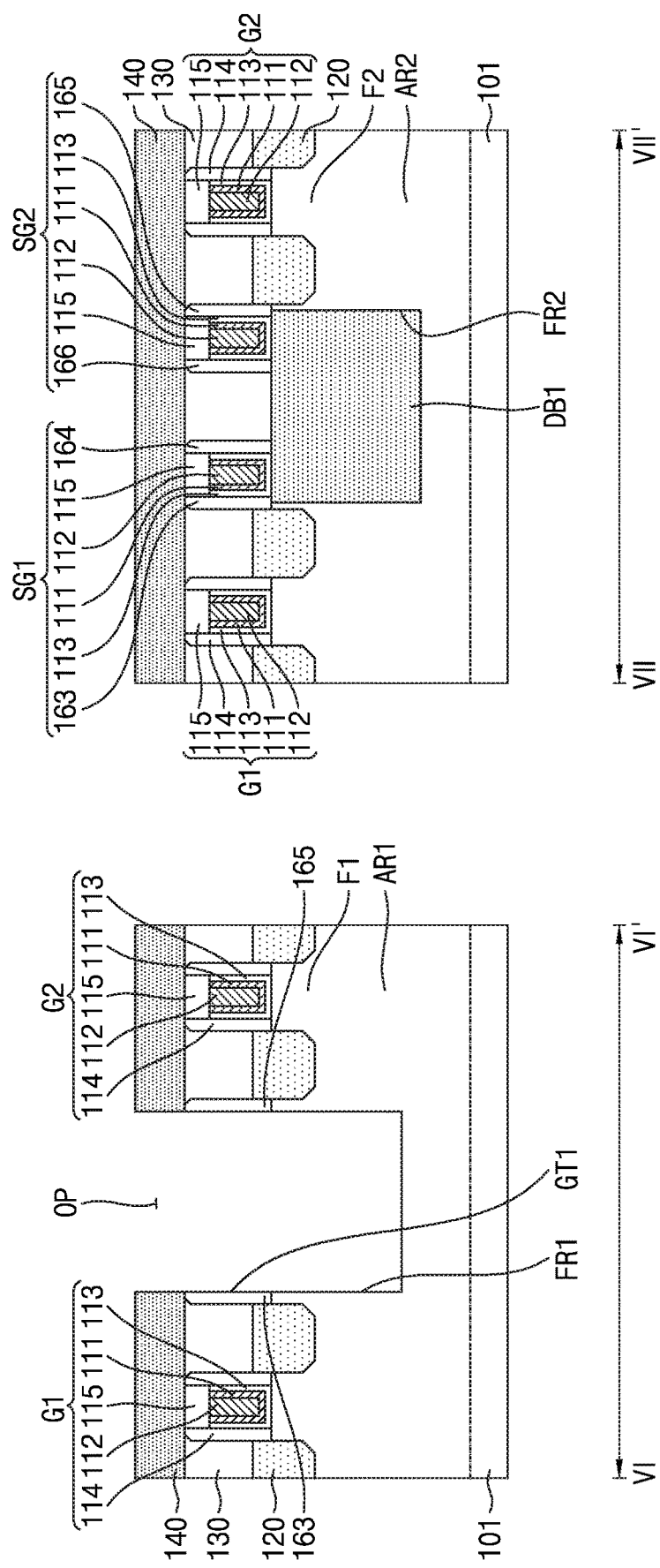

Referring to FIG. 12, the first active fins F1, the interlayer insulating layer 130, the spacers, and the source and drain regions 120 may be etched through the open regions OP and the first gate trench GT1, thereby forming a first gate trench GT1 having a large width and a first fin recess FR1 having a large width. The first gate trench GT1 having the large width may be integrally formed with the first fin recess FR1 having the large width to form an integral space. In some embodiments, the first gate trench GT1 may be connected to the first fin recess FR1, and the first gate trench GT1 and the first fin recess FR1 may form a single space as illustrated in FIG. 12. The first active fins F1, the first gate trench GT1 having the large width, and the first fin recess FR1 having the large width may form one trench.

Figure 13:
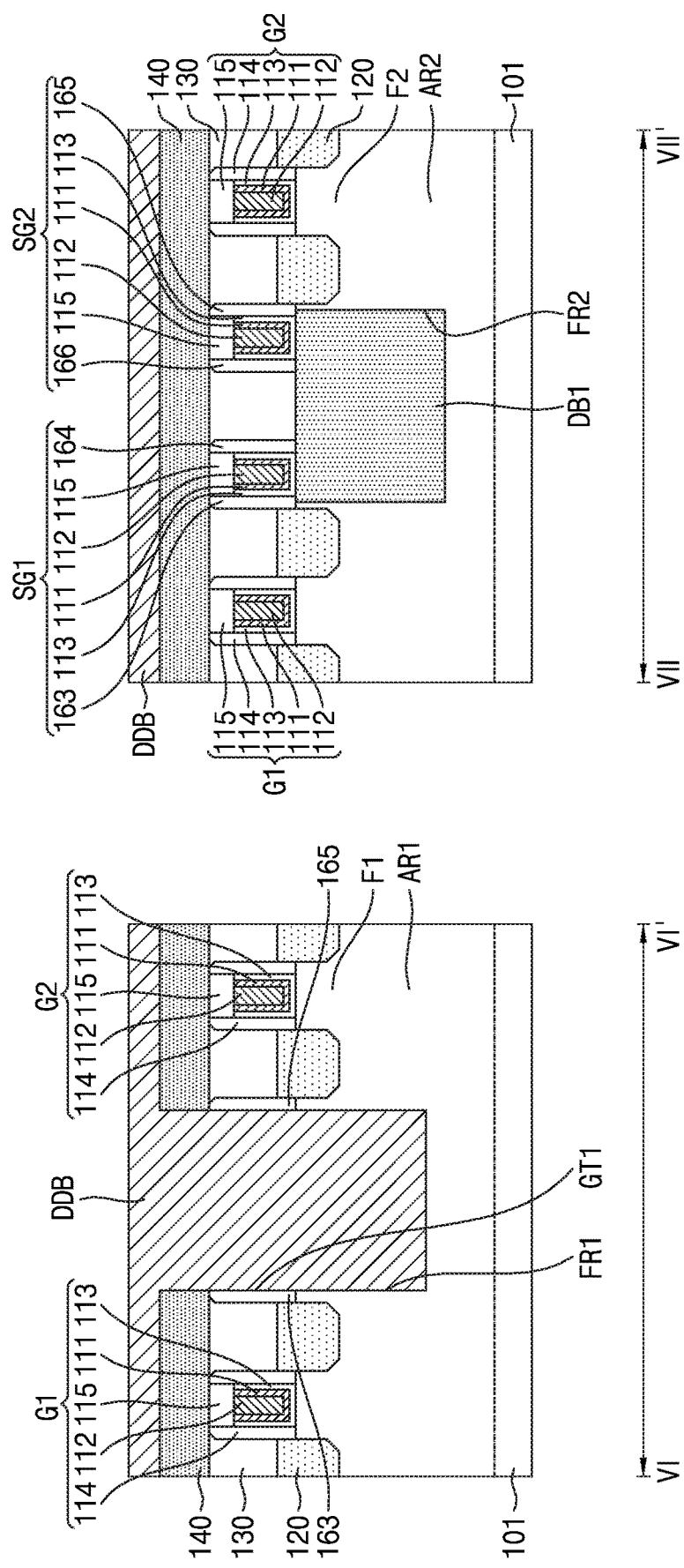

Referring to FIG. 13, a double diffusion break region DDB may be formed to fill (e.g., completely fill) the first fin recess FR1 having the large width and the first gate trench GT1 having the large width. The double diffusion break region DDB may further fill the open regions OP. The double diffusion break region DDB may be formed to cover the mask layer 140.

Figure 14:
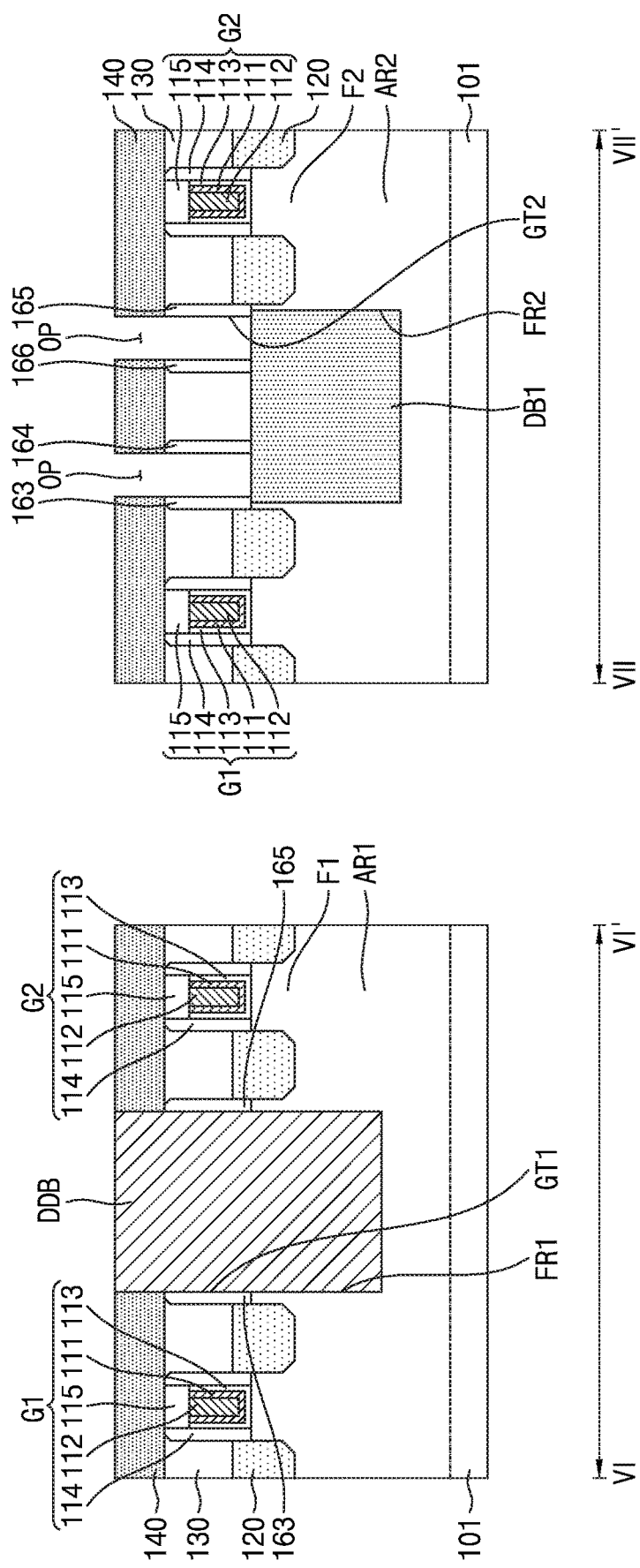

Referring to FIG. 14, a top surface of the mask layer 140 may be exposed using, for example, a planarization process. Although not shown, a photoresist film may be formed on the exposed top surface of the mask layer 140. For example, the photoresist film may be formed to be aligned with sidewalls of spacers of the sacrificial gate structures SG1 and SG2 in the second region N. In the second region N, the open regions OP of the mask layer 140 may be formed by etching the portions of the mask layer 140 using the photoresist film as an etch mask. In the second region N, top surfaces of the sacrificial gate structure SG1 and SG2 may be exposed by the open regions OP of the mask layer 140. After the open regions OP are formed, the photoresist film may be removed.

In the second region N, the gate capping layer 115, the gate electrode 111 and 112, and the gate insulating layer 113 of the sacrificial gate structures SG1 and SG2 may be sequentially removed through the open regions OP. The gate capping layer 115, the gate electrode 111 and 112, and the gate insulating layer 113 may be removed to form a second gate trench GT2. The second gate trench GT2 may expose the sidewalls of the spacers, an upper portion of the lower diffusion break region DB1, a top surface of a device isolation layer STI and DTI, and side surfaces of the double diffusion break region DDB. The top surface of the device isolation layer ST1 and DTI, which is exposed by the second gate trench GT2, may be at a higher level than, or the same level as, the top surface of the device isolation layer STI and DTI in the first region P.

Figure 15:
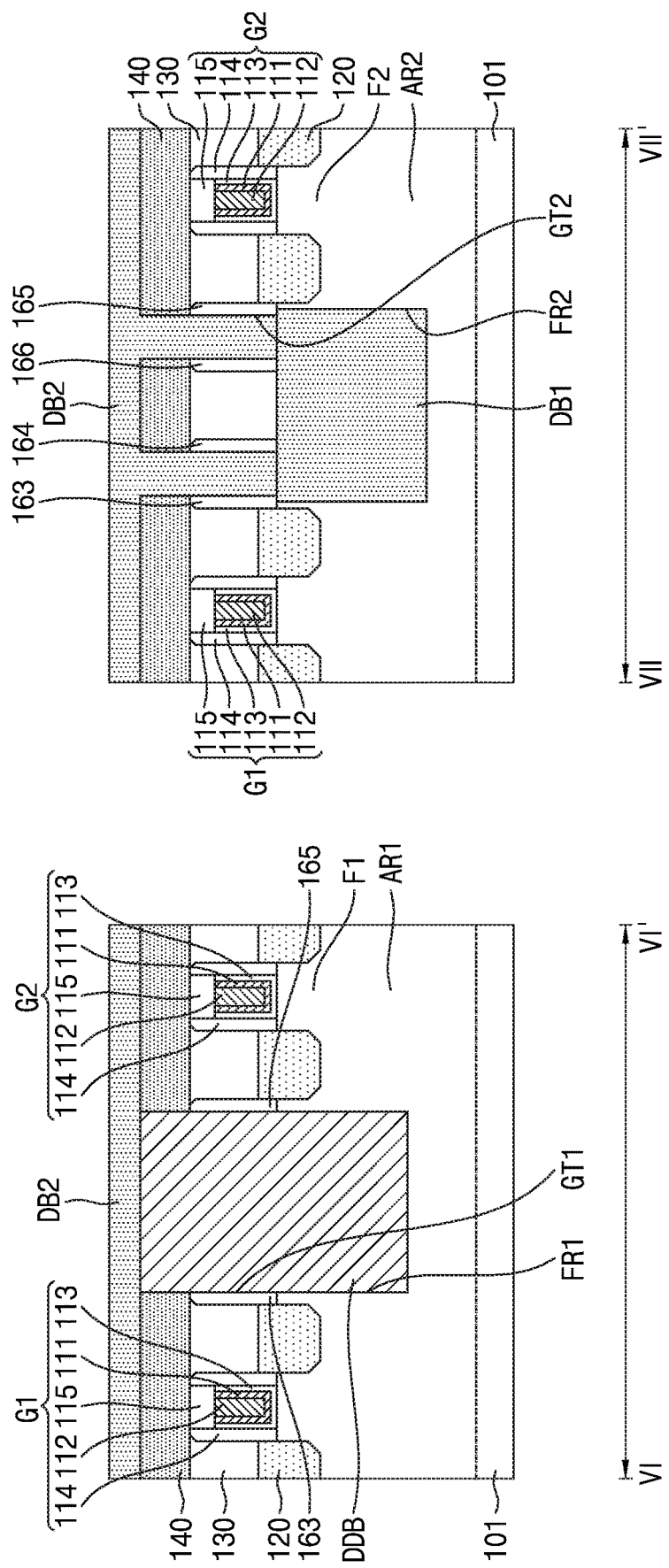

Referring to FIG. 15, an upper diffusion break region DB2 may be formed to fill (e.g., completely fill) the second gate trench GT2. The upper diffusion break region DB2 may be in contact with the lower diffusion break region DB1. In some embodiments, the upper diffusion break region DB2 may be formed using an ALD process.

According to example embodiments of the inventive concept, a semiconductor device can include diffusing break regions including different materials in a PMOS region and an NMOS region. In semiconductor devices according to some embodiments of the inventive concept, voltage characteristics of the PMOS region can be improved, and additional tensile stress can be applied to the NMOS region to increase or possibly optimize stress.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a substrate comprising a P-type metal-oxide-semiconductor (PMOS) region and an N-type MOS (NMOS) region;
   a plurality of first active fins extending in a first direction on the PMOS region;
   a plurality of second active fins extending parallel to the plurality of first active fins on the NMOS region;
   a first gate structure and a second gate structure extending in a second direction and being spaced apart from each other in the first direction, each of the first and second gate structures traversing one of the plurality of first active fins and one of the plurality of second active fins;
   a lower diffusion break region in the NMOS region of the substrate between two second active fins of plurality of the second active fins and between the first gate structure and the second gate structure; and
   an upper diffusion break region on the lower diffusion break region,
   wherein the lower diffusion break region comprises a single lower diffusion break region, the upper diffusion break region comprises a plurality of upper diffusion break regions that are spaced apart from each other in the first direction, and each of the plurality of upper diffusion break regions overlaps the single lower diffusion break region.

2. The semiconductor device of claim 1, wherein at least a portion of a bottom surface of one of the plurality of upper diffusion break regions is in contact with a top surface of the lower diffusion break region.

3. The semiconductor device of claim 1, wherein one of the plurality of upper diffusion break regions extends downward below a top surface of the lower diffusion break region.

4. The semiconductor device of claim 1, further comprising a multiple diffusion break region between the first gate structure and the second gate structure on the PMOS region,
   wherein a side surface of the multiple diffusion break region is in contact with a side surface of one of the plurality of upper diffusion break regions.

5. The semiconductor device of claim 4, wherein the multiple diffusion break region comprises a compressive stress material, and the lower diffusion break region and the plurality of upper diffusion break regions comprise a tensile stress material.

6. The semiconductor device of claim 4, further comprising a device isolation layer defining the plurality of first active fins and the plurality of second active fins,
   wherein the multiple diffusion break region extends on the device isolation layer in the second direction, and a portion of the multiple diffusion break region extends between two first active fins of the plurality of first active fins.

7. The semiconductor device of claim 4, wherein the multiple diffusion break region comprises a plurality of multiple diffusion break regions that are spaced apart from each other in the first direction, and
   wherein each of the plurality of multiple diffusion break regions is aligned with a respective one of the plurality of upper diffusion break regions in the second direction.

8. The semiconductor device of claim 4, wherein the multiple diffusion break region comprises a portion in the PMOS region of the substrate and a portion protruding upwardly beyond a top surface of the PMOS region of the substrate.

9. The semiconductor device of claim 4, wherein the multiple diffusion break region has a width in the first direction at least twice a width of the first gate structure in the first direction.

10. The semiconductor device of claim 1, wherein each of the plurality of upper diffusion break regions contacts the lower diffusion break region.

11. The semiconductor device of claim 1, further comprising a plurality of multiple diffusion break regions between the first gate structure and the second gate structure on the PMOS region,
wherein the plurality of multiple diffusion break regions are spaced apart from each other in the first direction, and each of the plurality of multiple diffusion break regions is aligned with a respective one of the plurality of upper diffusion break regions in the second direction.

12. The semiconductor device of claim 11, wherein the plurality of multiple diffusion break regions and the plurality of upper diffusion break regions comprise different materials.

13. The semiconductor device of claim 12, wherein the plurality of upper diffusion break regions comprise a tensile stress material.

14. The semiconductor device of claim 1, further comprising:
spacers between the first gate structure and the second gate structure, wherein the spacers continuously extend from the PMOS region onto the NMOS region in the second direction; and
a multiple diffusion break region between the first gate structure and the second gate structure on the PMOS region,
wherein the multiple diffusion break region and one of the plurality of upper diffusion break regions are between the spacers and are arranged along the second direction.

15. A semiconductor device comprising:
a substrate comprising a P-type metal-oxide-semiconductor (PMOS) region and an N-type MOS (NMOS) region;
a plurality of first active fins extending in a first direction on the PMOS region;
a plurality of second active fins extending parallel to the plurality of first active fins on the NMOS region;
a first gate structure and a second gate structure extending in a second direction and being spaced apart from each other in the first direction, each of the first and second gate structures traversing one of the plurality of first active fins and one of the plurality of second active fins;
a lower diffusion break region in the NMOS region of the substrate between two second active fins of plurality of the second active fins and between the first gate structure and the second gate structure;
an upper diffusion break region on the lower diffusion break region; and
a multiple diffusion break region between the first gate structure and the second gate structure on the PMOS region,
wherein the multiple diffusion break region comprises a compressive stress material, and the lower diffusion break region and the upper diffusion break region comprise a tensile stress material.

16. The semiconductor device of claim 15, wherein the multiple diffusion break region is aligned with the lower diffusion break region in the second direction.

17. The semiconductor device of claim 15, wherein the upper diffusion break region comprises a plurality of upper diffusion break regions that overlap the lower diffusion break region and are spaced apart from each other in the first direction.

18. The semiconductor device of claim 15, further comprising spacers between the first gate structure and the second gate structure,
wherein the spacers continuously extend from the PMOS region onto the NMOS region in the second direction, and the multiple diffusion break region and the upper diffusion break region are between the spacers and are arranged along the second direction.

* * * * *